US011394373B1

(12) United States Patent
Yang et al.

(10) Patent No.: US 11,394,373 B1
(45) Date of Patent: Jul. 19, 2022

(54) MANAGING FLIP FLOP CIRCUITS

(71) Applicant: Macronix International Co., Ltd., Hsinchu (TW)

(72) Inventors: Shang-Chi Yang, Changhua (TW); Hui-Yao Kao, New Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 17/496,291

(22) Filed: Oct. 7, 2021

(51) Int. Cl.
*H03K 3/037* (2006.01)
*H03K 3/356* (2006.01)
*G06F 1/10* (2006.01)
*H03K 3/3562* (2006.01)

(52) U.S. Cl.
CPC ............ *H03K 3/0375* (2013.01); *G06F 1/10* (2013.01); *H03K 3/037* (2013.01); *H03K 3/35625* (2013.01); *H03K 3/356139* (2013.01)

(58) Field of Classification Search
CPC .. H03K 3/0372; H03K 3/0375; H03K 3/3562; H03K 3/35625; H03K 3/35613; H03K 3/356139
See application file for complete search history.

(56) References Cited

U.S. PATENT DOCUMENTS

| 6,512,704 | B1 | 1/2003 | Wu et al. |
| 6,686,769 | B1 | 2/2004 | Nguyen et al. |
| 7,439,775 | B2 * | 10/2008 | Sohn ...................... G11C 7/065 |
| | | | 327/55 |
| 7,567,483 | B2 | 7/2009 | Kim |
| 8,069,363 | B2 | 11/2011 | Roth et al. |
| 8,324,951 | B1 | 12/2012 | Zarkesh-Ha et al. |
| 8,649,210 | B2 | 2/2014 | Lin et al. |
| 8,742,796 | B2 | 6/2014 | Dally et al. |
| 9,087,614 | B2 | 7/2015 | Son et al. |
| 10,038,429 | B1 * | 7/2018 | Narayanan ............. H03K 3/013 |
| 10,651,829 | B2 * | 5/2020 | Kim ...................... H03K 5/023 |
| 2005/0018494 | A1 | 1/2005 | Wu et al. |
| 2013/0249612 | A1 | 9/2013 | Zerbe et al. |

FOREIGN PATENT DOCUMENTS

CN 101154434 B 7/2012

* cited by examiner

*Primary Examiner* — Patrick O Neill
(74) *Attorney, Agent, or Firm* — Fish & Richardson P.C.

(57) ABSTRACT

Systems, methods, circuits, and apparatus for managing flip flop circuits are provided. In one aspect, a flip flop circuit includes a first sub-circuit having a first inner node between a first input node and a first output node, a second sub-circuit having a second inner node between a second input node and a second output node, and a third sub-circuit coupled between the first and second inner nodes. The third sub-circuit is configured to be: in an open state to conductively disconnect the first and second inner nodes, and in a close state to conductively connect the first and second inner nodes, such that a first output at the first output node corresponds to a second input at the second input node and a second output at the second output node corresponds to a first input at the first input node.

20 Claims, 10 Drawing Sheets

MANAGING FLIP FLOP CIRCUITS

BACKGROUND

Flip flop (or flip-flop) circuits are widely used in digital circuits to store data. Power, delay, and reliability of the flip flop circuits directly affect the performance and fault tolerance of a whole integrated circuit formed on a semiconductor chip. For example, in a high speed circuit system, a clock cycle becomes shorter as the circuit system becomes faster. As a flip flop circuit receives data in a clock period, the flip flop circuit needs to act faster. Also a leakage current may change the data latched in the flip flop circuit. Therefore, it is desirable to provide flip flop circuits with high speed and high reliability.

SUMMARY

The present disclosure describes systems and techniques for managing flip flop circuits, e.g., with high speed and high reliability (such as latched data stability and device mismatch tolerance), which can be implemented in high speed memory devices, e.g., Double Data Rate (DDR) memory devices.

One aspect of the present disclosure features an integrated circuit including: a first sub-circuit having a first input node, a first output node, and a first inner node between the first input node and the first output node; a second sub-circuit having a second input node, a second output node, and a second inner node between the second input node and the second output node; and a third sub-circuit coupled between the first inner node of the first sub-circuit and the second inner node of the second sub-circuit and configured to: be in an open state to conductively disconnect the first inner node and the second inner node, and be in a close state to conductively connect the first inner node and the second inner node, such that a first output at the first output node corresponds to a second input at the second input node and a second output at the second output node corresponds to a first input at the first input node.

In some embodiments, each of the first sub-circuit and the second sub-circuit is configured to receive a supply voltage, and the third sub-circuit is configured to receive a bias voltage that is different from the supply voltage.

In some embodiments, the first sub-circuit includes a first transistor coupled with the first inner node and the first output node, and the second sub-circuit includes a second transistor coupled with the second inner node and the second output node, the third sub-circuit includes a third transistor having a gate terminal configured to receive the bias voltage, a source terminal coupled to the first inner node and a drain terminal coupled to the second inner node, and the third transistor is configured to: be on to turn the third sub-circuit into the close state, and be off to turn the third sub-circuit into the open state.

In some embodiments, each of the first sub-circuit and the second sub-circuit has a clock input node configured to receive a clock signal having a first state and a second state. When the clock input node is at the first state, the first transistor and the second transistor are turned on, the third transistor is turned off, and a voltage at the first inner node and a voltage at the second inner node are independent from each other. When the clock input node is switched from the first state to the second state, the third transistor is turned on, such that a current flows from one of the first and second inner nodes to the other one of the first and second inner nodes through the third transistor to cause the first output at the first output node to correspond to the second input at the second input node and the second output at the second output node to correspond to the first input at the first input node.

In some embodiments, the first sub-circuit further includes a fourth transistor and the second sub-circuit further includes a fifth transistor, and source terminals of the fourth and fifth transistors are coupled to the supply voltage, a drain terminal of the fourth transistor and a gate terminal of the fifth transistor are coupled to the first output node, and a drain terminal of the fifth transistor and a gate terminal of the fourth transistor are coupled to the second output node. When the clock input node is at the second state, the third transistor is on such that a leakage current from one of the fourth and fifth transistors is discharged through the third transistor to keep the first data output and the second data output unchanged. The fourth and fifth transistors can have a transistor type different from that of the first, second, and third transistors.

In some embodiments, the first sub-circuit further includes a sixth transistor having a gate terminal as the first input node and a drain terminal coupled to the first inner node, the second sub-circuit further includes a seventh transistor having a gate terminal as the second input node and a drain terminal coupled to the second inner node, and the integrated circuit further includes an eighth transistor having a drain terminal coupled to source terminals of the sixth transistor and the seventh transistor, a gate terminal configured to receive the clock signal, and a source terminal coupled to a ground or the supply voltage.

In some embodiments, the first transistor has a drain terminal coupled to the first output node, a gate terminal coupled to the second output node, and a source terminal coupled to the first inner node, the second transistor has a drain terminal coupled to the second output node, a gate terminal coupled to the first output node, and a source terminal coupled to the second inner node. When the clock input node is at the first state, a voltage at the first output node is identical to $V_{DD}$, a voltage at the second output node is identical to $V_{DD}$, the voltage at the first inner node is identical to $V_{DD}-V_{TH1}$, and the voltage at the second inner node is identical to $V_{DD}-V_{TH2}$, where $V_{DD}$ represents the supply voltage, $V_{TH1}$, $V_{TH2}$ represent threshold voltages of the first transistor and the second transistor, respectively.

In some embodiments, each of the first, second, and third transistor is a respective n-type transistor. The bias voltage is configured to be within a voltage range as follows:

$$V_{TH3} < V_{BIAS} < V_{DD} + \min(V_{TH1}, V_{TH2}) - V_{TH3},$$

where $V_{DD}$ and $V_{BIAS}$ represent the supply voltage and the bias voltage, respectively, $V_{TH1}$, $V_{TH2}$, and $V_{TH3}$ represent threshold voltages of the first transistor, the second transistor, and the third transistor, respectively.

In some embodiments, each of the first, second, and third transistor is a respective p-type transistor, and the bias voltage is configured to be within a voltage range as follows:

$$\max(V_{TH1}, V_{TH2}) - V_{TH3} < V_{BIAS} < V_{DD} - V_{TH3},$$

where $V_{DD}$ and $V_{BIAS}$ represent the supply voltage and the bias voltage, respectively, $V_{TH1}$, $V_{TH2}$, and $V_{TH3}$ represent threshold voltages of the first transistor, the second transistor, and the third transistor, respectively.

In some embodiments, the integrated circuit includes a flip-flop having the first sub-circuit, the second sub-circuit, and the third sub-circuit, the second input is complementary to the first input.

In some embodiments, the flip-flop further includes: a latching circuit configured to receive the first output from the first output node of the first sub-circuit and the second output from the second output node of the second sub-circuit.

Another aspect of the present disclosure features a device including: an interface configured to receive data and a plurality of flip flop circuits, each of the plurality of flip flop circuits including: a first sub-circuit having a first input node, a first output node, and a first inner node between the first input node and the first output node; a second sub-circuit having a second input node, a second output node, and a second inner node between the second input node and the second output node; and a third sub-circuit coupled between the first inner node of the first sub-circuit and the second inner node of the second sub-circuit and configured to: be in an open state to conductively disconnect the first inner node and the second inner node, and be in a close state to conductively connect the first inner node and the second inner node, such that a first data output at the first output node corresponds to a second data input at the second input node and a second data output at the second output node corresponds to a first data input at the first input node, the second data input being complementary to the first data input.

In some embodiments, each of the first sub-circuit and the second sub-circuit is configured to receive a supply voltage, and the third sub-circuit is configured to receive a bias voltage. The first sub-circuit includes a first transistor coupled with the first inner node and the first output node, and the second sub-circuit includes a second transistor coupled with the second inner node and the second output node. The third sub-circuit includes a third transistor having a gate terminal configured to receive the bias voltage, a source terminal coupled to the first inner node and a drain terminal coupled to the second inner node. Each of the first sub-circuit and the second sub-circuit has a clock input node configured to receive a clock signal having a first state and a second state. When the clock input node is at the first state, the first transistor and the second transistor are turned on, the third transistor is turned off, and a voltage at the first inner node and a voltage at the second inner node are independent from each other. When the clock input node is switched from the first state to the second state, the third transistor is turned on, such that a current flows from one of the first and second inner nodes to the other one of the first and second inner nodes through the third transistor to cause the first data output correspond to the second data input and the second data output correspond to the first data input.

In some embodiments, the first sub-circuit further includes a fourth transistor and the second sub-circuit further includes a fifth transistor. Source terminals of the fourth and fifth transistors are coupled to the supply voltage, a drain terminal of the fourth transistor and a gate terminal of the fifth transistor are coupled to the first output node, and a drain terminal of the fifth transistor and a gate terminal of the fourth transistor are coupled to the second output node. When the clock input node is at the second state, the third transistor is on such that a leakage current from one of the fourth and fifth transistors is discharged through the third transistor to keep the first data output and the second data output unchanged. The fourth and fifth transistors have a transistor type different from that of the first, second, and third transistors.

In some embodiments, the first sub-circuit further includes a sixth transistor having a gate terminal as the first input node and a drain terminal coupled to the first inner node, the second sub-circuit further includes a seventh transistor having a gate terminal as the second input node and a drain terminal coupled to the second inner node, and the flip flop circuit further includes an eighth transistor having a drain terminal coupled to source terminals of the sixth transistor and the seventh transistor, a gate terminal configured to receive the clock signal, and a source terminal coupled to a ground or the supply voltage.

In some embodiments, the first transistor has a drain terminal coupled to the first output node, a gate terminal coupled to the second output node, and a source terminal coupled to the first inner node, and the second transistor has a drain terminal coupled to the second output node, a gate terminal coupled to the first output node, and a source terminal coupled to the second inner node. When the clock input node is at the first state, a voltage at the first output node is identical to $V_{DD}$, a voltage at the second output node is identical to $V_{DD}$, the voltage at the first inner node is identical to $V_{DD}-V_{TH1}$, and the voltage at the second inner node is identical to $V_{DD}-V_{TH2}$, where $V_{DD}$ represents the supply voltage, $V_{TH1}$, $V_{TH2}$ represent threshold voltages of the first transistor and the second transistor, respectively.

In some embodiments, each of the first, second, and third transistor is a respective n-type transistor, and the bias voltage is configured to be within a voltage range as follows:

$$V_{TH3} < V_{BIAS} < V_{DD} + \min(V_{TH1}, V_{TH2}) - V_{TH3},$$

where $V_{DD}$ and $V_{BIAS}$ represent the supply voltage and the bias voltage, respectively, $V_{TH1}$, $V_{TH2}$, and $V_{TH3}$ represent threshold voltages of the first transistor, the second transistor, and the third transistor, respectively.

In some embodiments, each of the first, second, and third transistor is a respective p-type transistor, and the bias voltage is configured to be within a voltage range as follows:

$$\max(V_{TH1}, V_{TH2}) - V_{TH3} < V_{BIAS} < V_{DD} - V_{TH3},$$

where $V_{DD}$ and $V_{BIAS}$ represent the supply voltage and the bias voltage, respectively, $V_{TH1}$, $V_{TH2}$, and $V_{TH3}$ represent threshold voltages of the first transistor, the second transistor, and the third transistor, respectively.

In some embodiments, each of the plurality of flip flop circuits further includes: a latching circuit configured to receive the first data output from the first output node of the first sub-circuit and the second data output from the second output node of the second sub-circuit and provide an output corresponding to at least one of the first data output or the second data output.

A further aspect of the present disclosure features a flip flop circuit including: a first latching circuit including: a first sub-circuit having a first input node, a first output node, and a first inner node between the first input node and the first output node; a second sub-circuit having a second input node, a second output node, and a second inner node between the second input node and the second output node; and a third sub-circuit coupled between the first inner node of the first sub-circuit and the second inner node of the second sub-circuit and configured to: be off to conductively disconnect the first inner node and the second inner node, and be on to conductively connect the first inner node and the second inner node, such that a first data output at the first output node corresponds to a second data input at the second input node and a second data output at the second output node corresponds to a first data input at the first input node, the second data input being complementary to the first data input; and a second latching circuit configured to receive the first data output from the first output node and the second data output from the second output node and provide an output corresponding to at least one of the first data output or the second data output.

The subject matter described in the present disclosure can be implemented in particular embodiments to realize one or more of the following advantages. For example, implementations of the present disclosure provide a flip flop circuit, e.g., in a high speed system, that includes a transistor configured to be turned on to discharge a current due to subordinate leakage during a latching (or holding) phase. Unlike conventional circuits (e.g., strong arm latches) that suffer from device mismatch (or offset) issues, the transistor in the flip flop circuit can reduce or eliminate the device mismatch issues. For example, the transistor can be applied with a bias gate voltage, instead of a supply voltage, to be turned off during a precharge phase, such that mismatched devices, e.g., mismatched transistors, can be independently precharged to different voltages, which can reduce the mismatch or offset effect of the devices. Additionally, an equivalent resistance of the transistor applied with the bias gate voltage can be larger than that of the transistor in the conventional circuits like strong arm latches, which can make the flip fop circuit act faster to have a shorter response time. The shorter response time can accordingly reduce or eliminate error bits in data input or output and improve the performance of the system. That is, the flip flop circuit can have better mismatch tolerance than conventional circuits and a higher speed.

The techniques can be implemented with any types of transistors, such as any types of metal-oxide-silicon (MOS) transistors, e.g., metal-oxide-silicon field-effect transistors (MOSFETs), and a transistor can be an n-channel (or n-type) transistor, e.g., NMOS or N-MOSFET, or p-channel (or p-type) transistor, e.g., PMOS or P-MOSFET. The transistor in the flip flop circuit can be replaced with any circuit or scheme which is turned on during a sensing and/or latching phase and turned-off during a precharge phase. The techniques can be implemented in any type of circuits or devices that need to separate two nodes without interference with each other during a first phase and to connect the two nodes during a second, subsequent phase.

The techniques can be implemented for any type of circuits or devices that need high speed and/or high reliability such as high data stability and/or high device mismatch tolerance. For example, the techniques can be applied to any type of memory device, such as Dynamic Random Access Memory (DRAM), Synchronous Dynamic Random-Access Memory (SDRAM) such as DDR SDRAM, flash memory such as NOR flash memory or NAND flash memory, resistive random-access memory (RRAM), phase-change random-access memory (PCRAM), Magnetoresistive random-access memory (MRAM), among others. Additionally or alternatively, the techniques can be applied to various types of devices and systems, such as secure digital (SD) cards, embedded multimedia cards (eMMC), or solid-state drives (SSDs), embedded systems, among others.

The details of one or more disclosed implementations are set forth in the accompanying drawings and the description below. Other features, aspects, and advantages will become apparent from the description, the drawings and the claims.

BRIEF DESCRIPTION OF THE DRAWINGS

Like reference numbers and designations in the various drawings indicate like elements.

DETAILED DESCRIPTION

Figure 1:
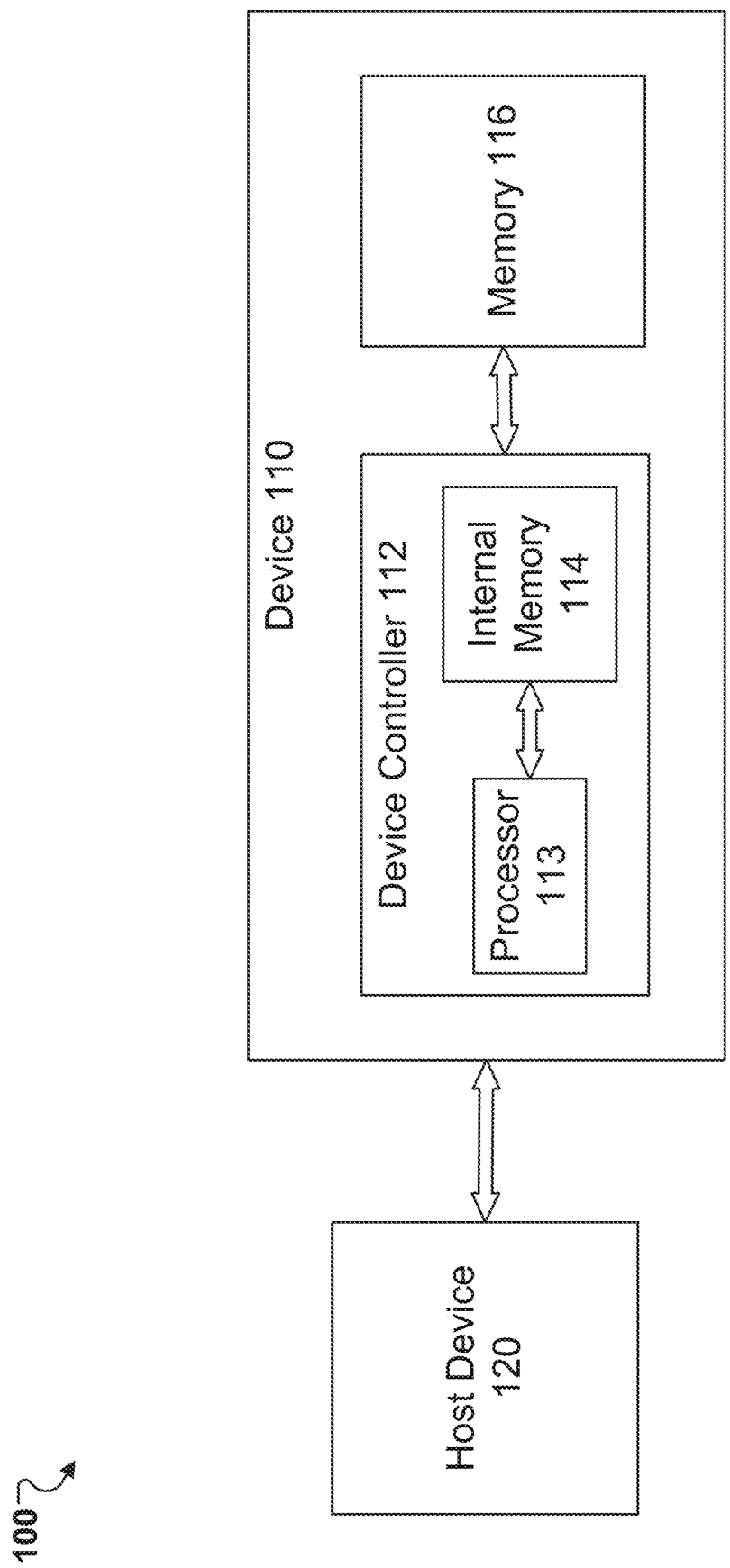
FIG. 1 is a schematic diagram illustrating an example of a system including a memory device, according to one or more implementations of the present disclosure.

FIG. 1 illustrates an example of a system 100. The system 100 includes a device 110 and a host device 120. The device 110 can be a memory system including a device controller 112 and a memory 116. The device controller 112 includes a processor 113 and an internal memory 114.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to a host device 120. For example, the device 110 is an SD card in a digital camera or a media player that is the host device 120.

The device controller 112 is a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller. The processor 113 is also referred to as a central processing unit (CPU).

The processor 113 accesses instructions and data from the internal memory 114. In some implementations, the internal memory is a cache memory that is included in the device controller 112, as shown in FIG. 1. The internal memory 114 stores instruction codes, which correspond to the instructions executed by the processor 113, and/or the data that are requested by the processor 113 during runtime.

The device controller 112 transfers the instruction code and/or the data from the memory 116 to the internal memory 114. In some implementations, the memory 116 is a non-volatile memory that is configured for long-term storage of instructions and/or data, e.g., a NAND flash memory device, or some other suitable non-volatile memory device. In implementations where the memory 116 is NAND flash memory, the device 110 is a flash memory device, e.g., a flash memory card, and the device controller 112 is a NAND flash controller. For example, in some implementations, when the device 110 is an eMMC or an SD card, the memory 116 is a NAND flash; in some implementations, when the device 110 is a digital camera, the memory 116 is an SD card; and in some implementations, when the device 110 is a media player, the memory 116 is a hard disk.

In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM. In some implementations, the memory 116 also includes an SRAM or DRAM chip as a data buffer.

A DDR SDRAM allows data transfers on both rising and falling edges of a clock signal, e.g., a clock signal of the device 110, and thus can provide twice as much data as a single data rate (SDR) SDRAM or twice faster than an operating speed of the SDR SDRAM. The DDR SDRAM is also capable of providing burst data at a high-speed data rate. Due to the high-speed data transfers, the DDR SDRAM can use a data register to register data being input or output on both edges of the clock signal. The data register can include flip flop circuits to store data.

Figure 2A:
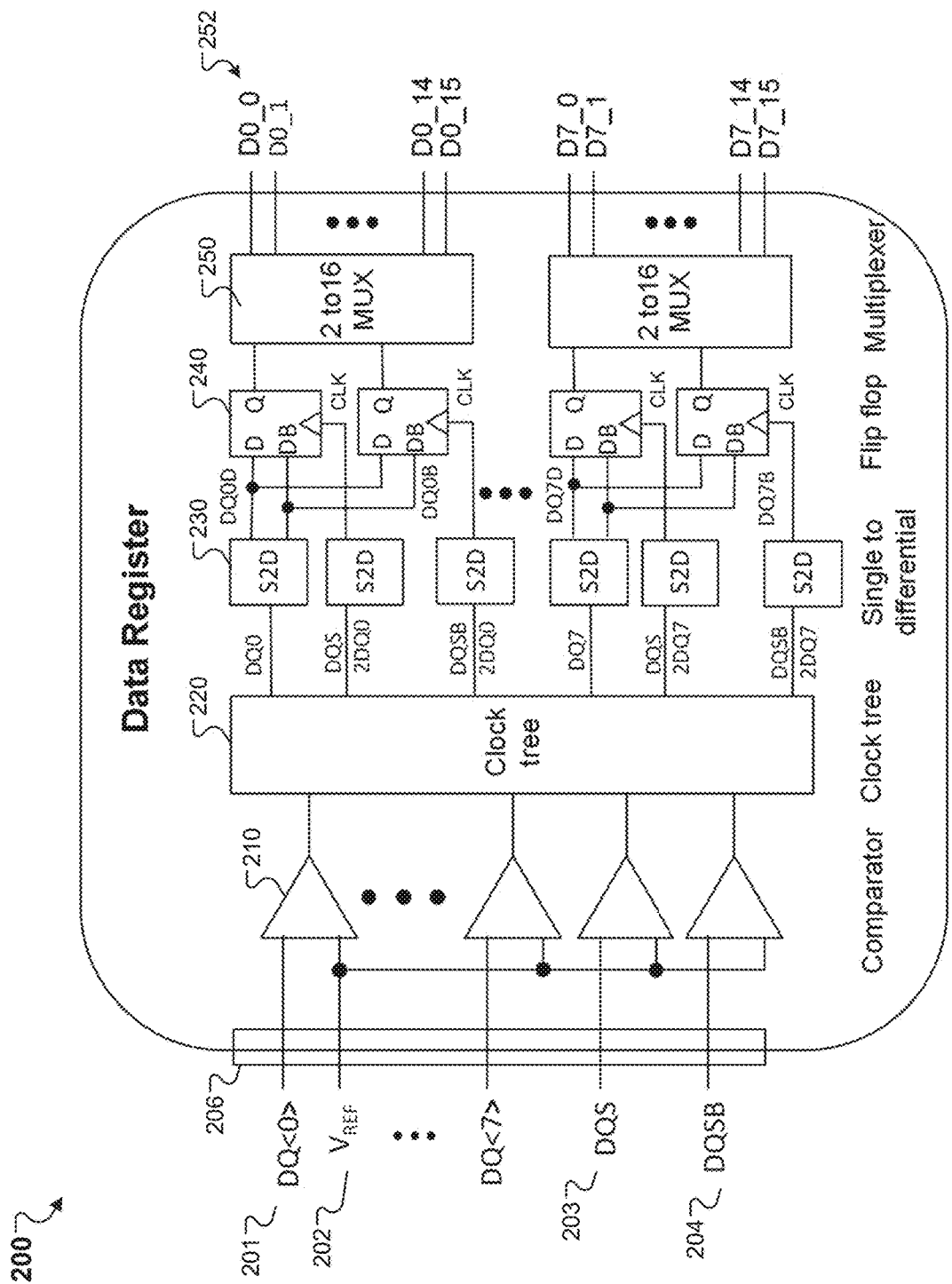
FIG. 2A is a schematic diagram illustrating an example data register including flip flop circuits, according to one or more implementations of the present disclosure.

FIG. 2A is a schematic diagram illustrating an example data register 200 including flip flop circuits, according to one or more implementations of the present disclosure. The data register 200 can be implemented in a random access memory (RAM) device, e.g., a DDR SDRAM. The RAM device can be in the internal memory 114 of FIG. 1 or the memory 116 of FIG. 1.

The data register 200 can be configured to simultaneously register a number of data inputs 201. For illustration purposes only, the following descriptions use 8 data inputs as an example, e.g., DQ<0>, . . . , DQ<7>. The data register 200 can also use a bi-directional data strobe (DQS) signal 203 and a data strobe bar (DQSB) signal 204 for providing clock signals for registering the data inputs 201. The DQSB signal 204 can be an inverted signal of the DQS signal 203.

As illustrated in FIG. 2A, the data register 200 includes an interface 206 including nodes (or pins) for receiving the data inputs 201, e.g., DQ<0>, . . . , DQ<7>, a reference voltage $V_{REF}$ 202, the DQS signal 203 and the DQSB signal 204, respectively. The data registers 200 includes a plurality of comparators 210 coupled to the interface 206. Each comparator 210 includes two input nodes and one output node. Each of the data inputs 201, the DQS signal 203, and the DQSB signal 204 is connected to one of the input nodes of a corresponding comparator 210 that receives the reference voltage $V_{REF}$ 202 at the other node of the input nodes. Each comparator 210 can compare the inputs at the two input nodes and outputs an output through the output node.

The data register 200 can include a clock tree 220 coupled to the comparators 210 and configured to provide an adjusted data input, e.g., DQi signal, with associated clock signals, e.g., DQS2DQi and DQSB2DQi, based on outputs from corresponding comparators 210 that are based on corresponding data input, e.g., DQ<i> data input, and the DQS signal 203 and the DQSB signal 204. Note that i is an integer, e.g., 0, 1, . . . , 7.

The data register 200 can include a plurality of single to differential (S2D) amplifiers 230. For each adjusted data input DQi, a respective S2D amplifier 230 is configured to generate a pair of inverted (or complemented) data signals DQiD and DQiB, e.g., "1" and "0", based on the adjusted data input DQi. The data signal DQiB can be considered as a complementary signal of the DQiD signal. Two S2D amplifiers 230 can also generate two clock signals based on the associated clock signals DQS2DQi and DQSB2DQi, respectively.

The data register 200 can include a plurality of flip flop circuits 240 coupled to the S2D amplifiers 230. Each flip flop circuit 240 can include two data input nodes D and DB, a clock input node CLK, and an output node Q. Each data input 201, e.g., DQ<i>, can correspond to three S2D amplifiers 230 and two flip flop circuits 240. A first flip flop circuit 240 is configured to receive the data signals, DQiD and DQiB, at corresponding data input nodes D and DB from a first S2D amplifier 230 and a first clock signal DQS2DQi from a second S2D amplifier 230. A second flip flop circuit 240 is configured to receive the same data signals, DQiD and DQiB, from the first S2D amplifier 230 and a second clock signal DQSB2DQi from a third S2D amplifier 230.

The data register 200 can further include a plurality of multiplexers (MUXs) 250, e.g., 2 to 16 multiplexers. Each data input 201, e.g., DQ<i>, corresponds to a respective MUX 250. For example, each 2 to 16 MUX 250 is configured to receive two outputs from two corresponding flip flop circuits 240 and generate 16 outputs 252, e.g., Di_0, Di_1, . . . , Di_14, Di_15.

Figure 2B:
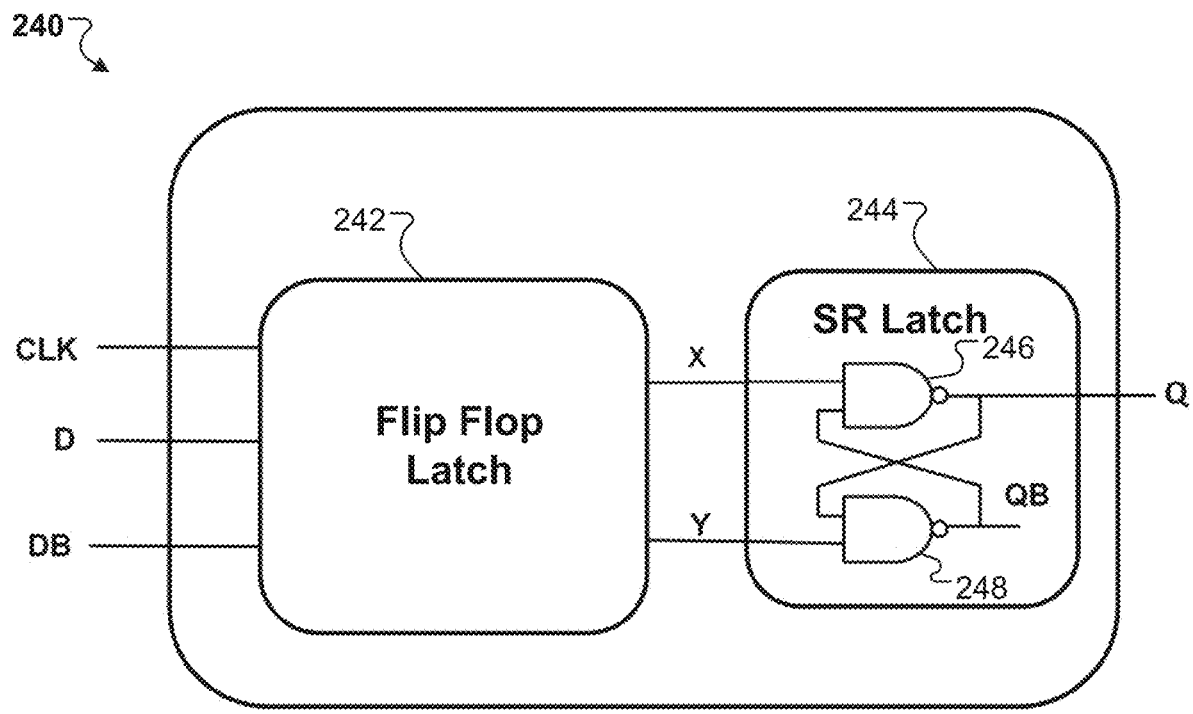
FIG. 2B is a schematic diagram illustrating an example flip flop circuit, according to one or more implementations of the present disclosure.

FIG. 2B is a schematic diagram illustrating an example flip flop circuit that can be implemented as the flip flop circuit 240 of FIG. 2A. As illustrated in FIG. 2B, the flip flop circuit 240 can include a first latching circuit 242, e.g., a flip flop latch circuit 242, and a second latching circuit 244, e.g., a SR latch circuit 244. As discussed with further details below, the flip flop latch circuit 242 can be implemented by a flip flop latch circuit 300 of FIGS. 3A-3C or a flip flop latch circuit 700 of FIG. 7A. The flip flop latch circuit 242 includes two data input nodes D and DB for receiving complementary signals, e.g., "1" and "0", a clock input node CLK, and two output nodes X and Y for generating two outputs, e.g., "1" and "0", "0" and "1", "1" and "1", or "0"

and "0". The SR latch circuit 244 can include a pair of cross-coupled 2-input NANDs 246, 248 that are connected to X and Y output nodes of the flip flop latch 242, respectively. Each of the inverters 246, 248 can be a NAND logic gate. Each NAND 246, 248 can generate a respective output at Q and QB nodes. As an example, if X, Y are 0 and 1, the SR latch circuit 244 can turn the outputs at Q and QB nodes to be 1, 0, respectively.

Figure 2C:
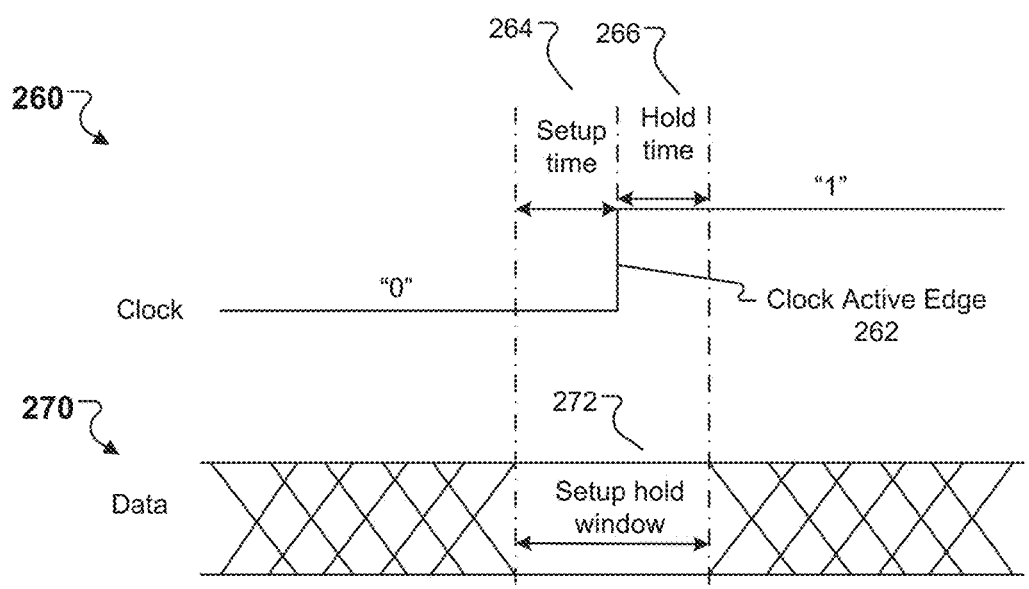
FIG. 2C is a diagram illustrating an example clock signal and an example data input signal, according to one or more implementations of the present disclosure.

FIG. 2C is a diagram illustrating an example clock signal 260 and an example data input signal 270 input to a flip flop circuit, according to one or more implementations of the present disclosure. The clock signal 260 includes a rising edge and a falling edge. Each of the edges can be used as a clock active edge for storing data in the data input signal 270. For illustration, as shown in FIG. 2C, the rising edge of the clock signal 260 is used be a clock active edge 262. The clock signal 260 has a lower level "0" and a higher level "1", which are separated by the clock active edge 262.

As discussed with further details below, e.g., in FIGS. 3A-3C, data in the data input signal 270 can be stored and held in the flip flop circuit during the setup hold window 272 that can include a setup time 264 before the clock active edge 262 and a hold time 266 after the clock active edge 262. The setup time 264 can represent a time period that the flip flop circuit stabilizes data input before the clock active edge 262, and the hold time 266 can be associated with a time period of a sensing phase of the flip flop circuit after the clock active edge 262. A response time of the flip flop circuit can represent a time period from a first time point when the flip flop circuit stabilizes data input to a second time point when the flip circuit provides outputs, and the response time can be associated with the setup time 264 and the hold time 266.

In a high speed circuit system, a clock cycle becomes shorter as the circuit system becomes faster. As a clock period is shorter, a response time of a flip flop circuit need to be even shorter, such that the flip flop circuit can accurately latch data in the clock period. In some cases, a strong arm latch circuit is implemented in the high speed circuit system to improve a speed and avoid a leakage current that can overcharge to change latched data. However, the strong arm latch circuit can make the hold time longer due to device mismatch (e.g., transistor mismatch).

Implementations of the present disclosure provide flip flop circuits that can address the device mismatch issues and leakage current issues, while also improving speeds. The flip flop circuits can be implemented by a flip flop circuit using an n-type transistor (e.g., N-MOSFET) as a connectable transistor as described in FIGS. 3A-3C, or a flip flop circuit using a p-type transistor (e.g., P-MOSFET) as the connectable transistor as described with further details in FIG. 7A. In either case, a bias voltage is applied to a gate of the connectable transistor in the flip flop circuit. Instead of using a supply voltage, the bias voltage can be adjusted or determined based on the supply voltage and one or more characteristics (e.g., threshold voltages) of transistors in the flip flop circuit, such that the connectable transistor is turned off during a precharge phase (e.g., a setup time period) to eliminate the device mismatch issue and turned on during a sensing phase (e.g., a hold time period) and a latching phase to eliminate the leaking current issue. The transistor applied with the bias voltage can have a larger equivalent resistance than that applied with the supply voltage, which can shorten the response time and improve the speed.

Figures 3A, 3B:
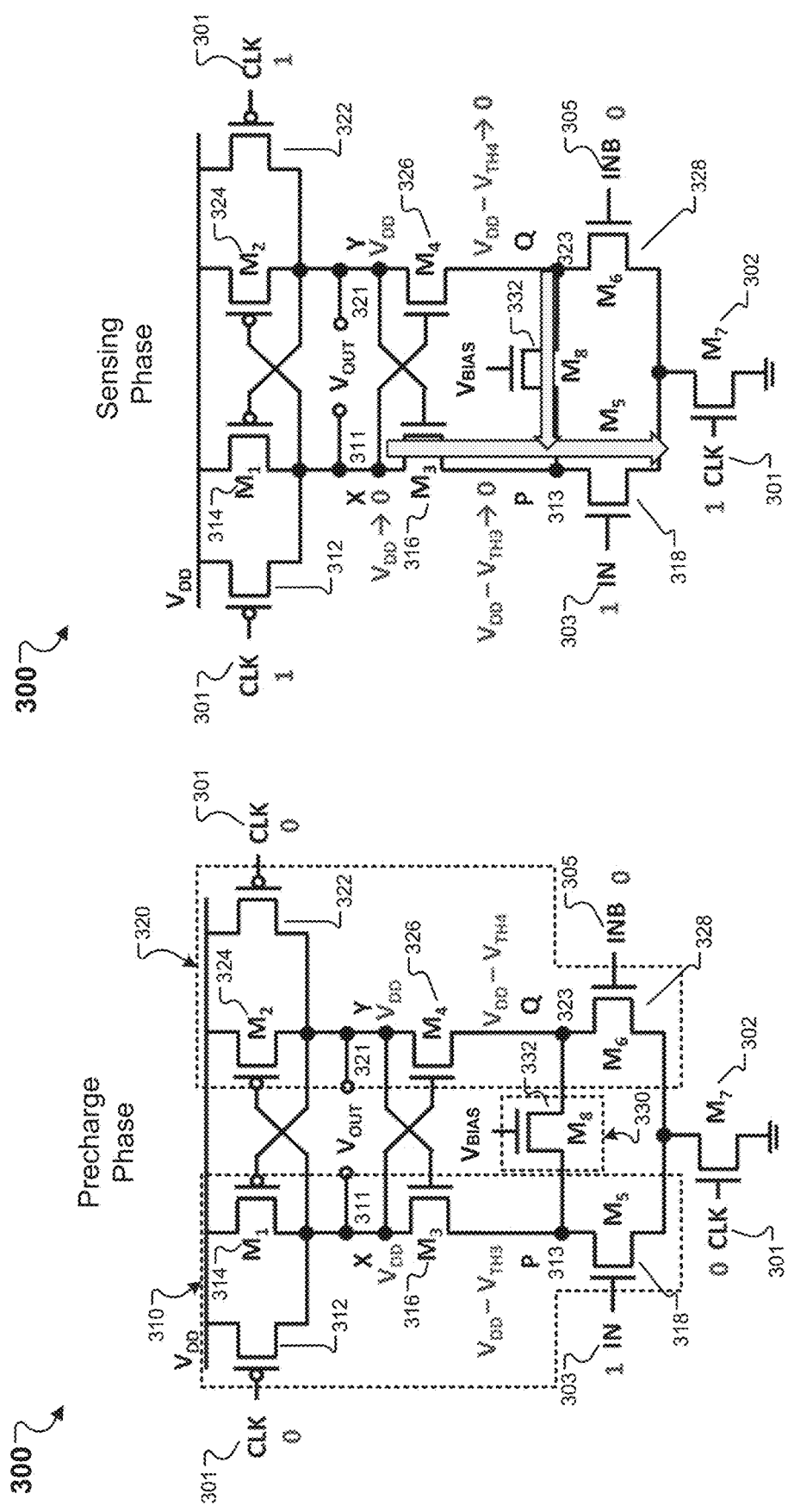
FIGS. 3A-3C are circuit diagrams illustrating an example flip flop latch circuit at different phases including a pre-charging phase (FIG. 3A), a sensing phase (FIG. 3B), and a latching phase (FIG. 3C), according to one or more implementations of the present disclosure.
Figures 3C, 3D:
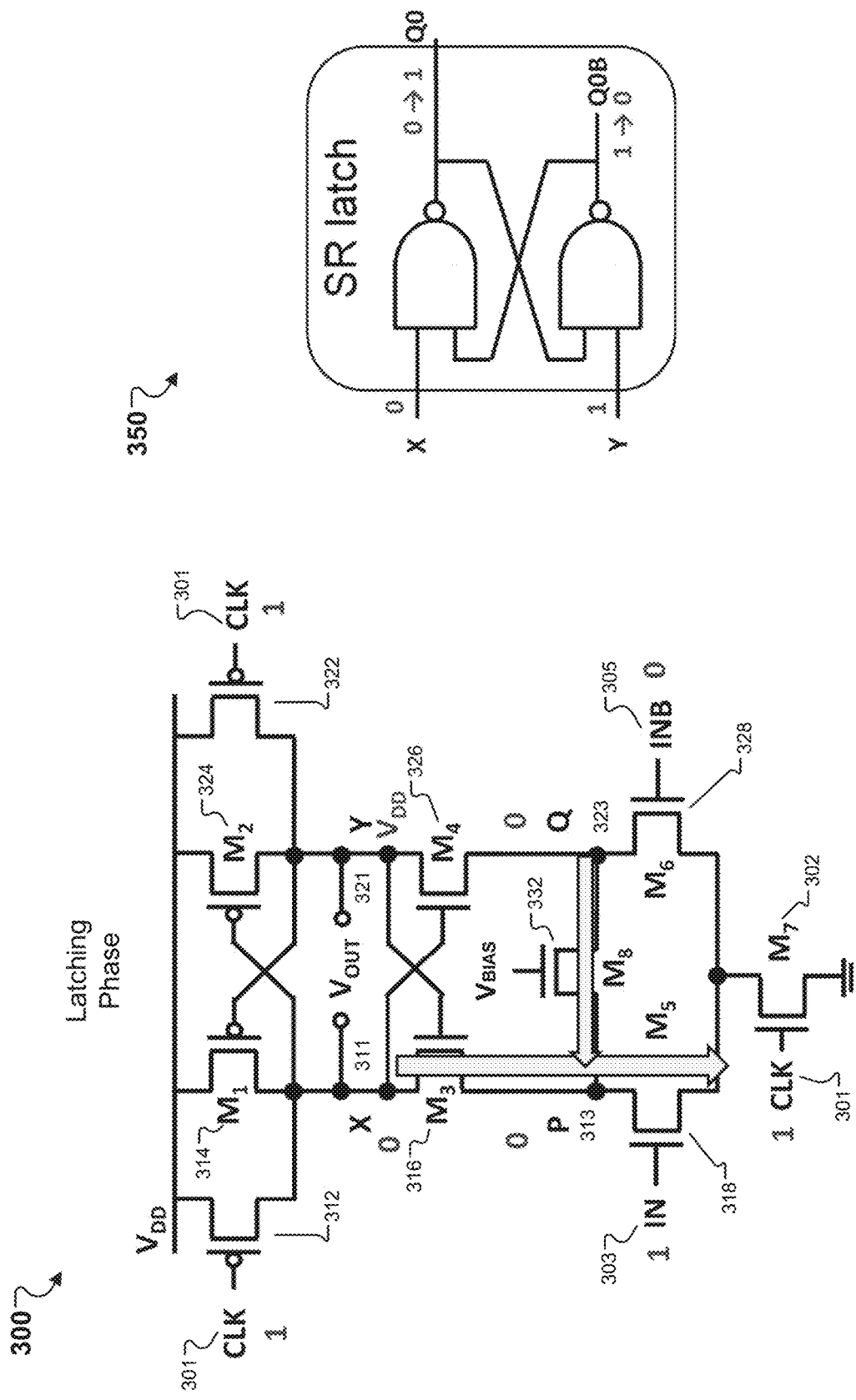
FIG. 3D is a circuit diagram illustrating an example Set/Reset (SR) latch circuit with an output changing with outputs of the flip flop latch circuit of FIG. 3C, according to one or more implementations of the present disclosure.
Figure 4:
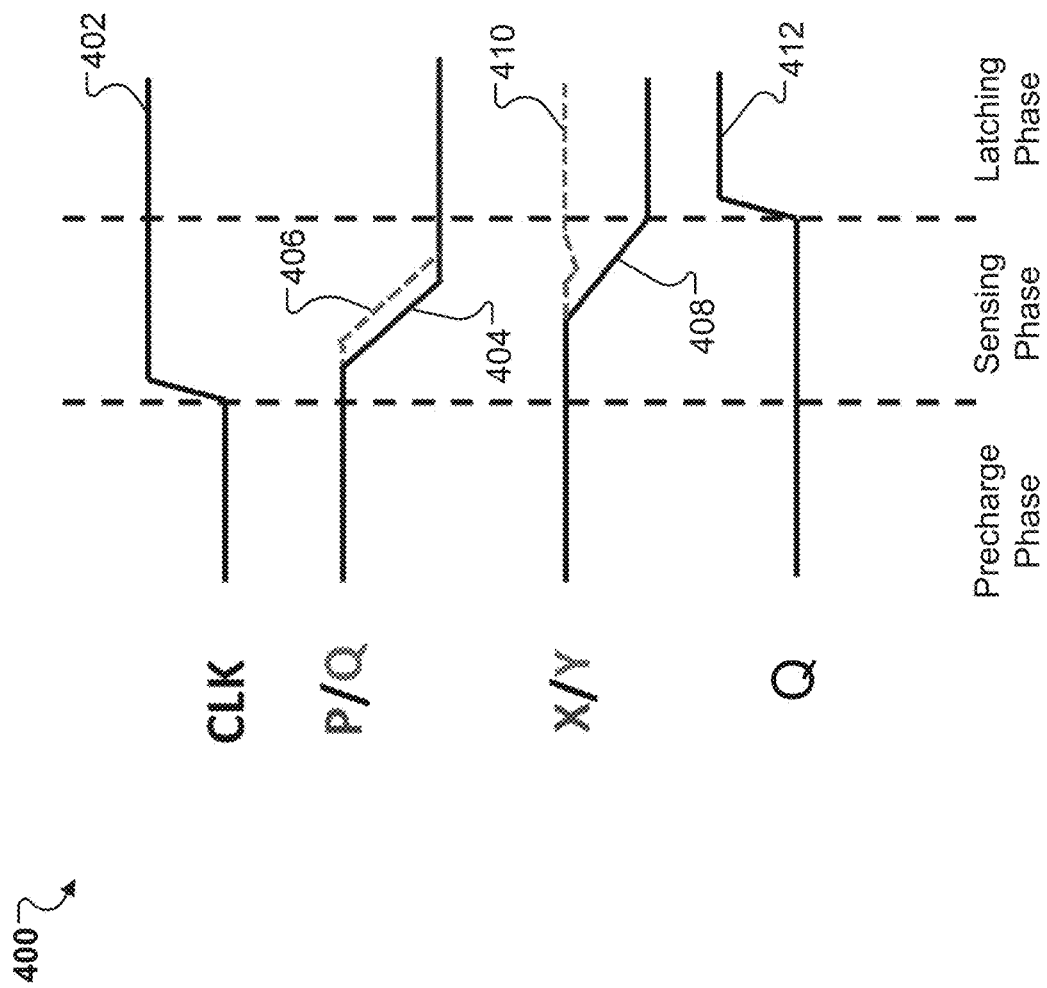
FIG. 4 is a schematic diagram illustrating changes of voltages in the flip flop latch circuit of FIGS. 3A-3C and the SR latch circuit of FIG. 3D.

FIGS. 3A-3C are circuit diagrams illustrating an example flip flop latch circuit 300 at different phases including a pre-charging phase (FIG. 3A), a sensing phase (FIG. 3B), and a latching phase (FIG. 3C), according to one or more implementations of the present disclosure. FIG. 3D is a circuit diagram illustrating an example SR latch circuit 350 with an output changing with outputs of the flip flop latch circuit of FIG. 3C, according to one or more implementations of the present disclosure. FIG. 4 is a schematic diagram 400 illustrating changes of voltages in the flip flop latch circuit 300 of FIGS. 3A-3C and the SR latch circuit 350 of FIG. 3D.

The flip flop latch circuit 300 can be implemented as the flip flop latch circuit 242 of FIG. 2B. The flip flop latch circuit 300 uses an n-type transistor, e.g., n-MOSFET, as a connectable transistor, e.g., transistor $M_8$. The SR latch circuit 350 can be implemented as the SR latch circuit 244 of FIG. 2C.

As illustrated in FIGS. 3A-3C, the flip flop latch circuit 300 includes a first sub-circuit 310, a second sub-circuit 320, and a third sub-circuit 330. The flip flop latch circuit 300 can also include two data input nodes IN 303 and INB 305 for receiving inversed (or complemented) data inputs (e.g., 1 and 0 or 0 and 1), and a clock input node 301 for receiving a clock signal. The flip flop latch circuit 300 can also include first and second output nodes X 311 and Y 321, where VOUT can be a voltage difference between the output nodes X 311 and Y 321. The flip flop latch circuit 300 can further include an n-type transistor $M_7$ 302 that has a gate connected to the clock input node 301, a drain terminal connected to the first sub-circuit 310 and the second sub-circuit 320, and a source terminal connected to a ground.

The first sub-circuit 310 and the second sub-circuit 320 are symmetric to each other and are cross-connected with each other. For example, the first sub-circuit 310 includes a p-type transistor $M_1$ 314 and the second sub-circuit 320 includes a p-type transistor $M_2$ 324. The transistors 314 and 324 both receive a supply voltage $V_{DD}$ at source terminals. A gate terminal of the transistor 314 is coupled to a drain terminal of the transistor 324, while a gate terminal of the transistor 324 is coupled to a drain terminal of the transistor 314. Similarly, the first sub-circuit 310 includes an n-type transistor $M_3$ 316 and the second sub-circuit 320 includes an n-type transistor $M_4$ 326. A gate terminal of the transistor 316 is coupled to a drain terminal of the transistor 326, while a gate terminal of the transistor 326 is coupled to a drain terminal of the transistor 316. The first output node X 311 is between the drain terminal of the transistor 314 and the drain terminal of the transistor 316, while the second output node Y 321 is between the drain terminal of the transistor 324 and the drain terminal of the transistor 326.

Additionally, the first sub-circuit 310 includes a p-type transistor 312 having a gate terminal coupled to the clock input node 301 for receiving the clock signal, and the second sub-circuit 320 includes a p-type transistor 322 having a gate terminal coupled to the clock input node 301 for receiving the clock signal. Both source terminals of the transistors 312 and 322 are configured to receive the supply voltage $V_{DD}$. A drain terminal of the transistor 312 is coupled between the drain terminal of the transistor 314 and the first output node X in the first sub-circuit 310, while a drain terminal of the transistor 322 is coupled between the drain terminal of the transistor 324 and the second output node Y in the second sub-circuit 320.

The first sub-circuit 310 includes an n-type transistor $M_5$ 318 that has a gate terminal coupled to the data input node IN 303, and the second sub-circuit 320 includes an n-type transistor $M_6$ 328 that has a gate terminal coupled to the data input node INB 305. Source terminals of the transistors 318 and 328 are both coupled to the drain terminal of the transistor 302. A drain terminal of the transistor 318 is coupled to a source terminal of the transistor 316 in the first sub-circuit 310, with a first internal node P is between the drain terminal of the transistor 318 and the source terminal of the transistor 316. A drain terminal of the transistor 328 is coupled to a source terminal of the transistor 326 in the second sub-circuit 320, with a second internal node Q is between the drain terminal of the transistor 328 and the source terminal of the transistor 326.

The third sub-circuit 330 is coupled between the first inner node P 313 of the first sub-circuit 310 and the second inner node Q 323 of the second sub-circuit 320. The third sub-circuit 330 can be configured to be in an open state to conductively disconnect the first inner node P 313 and the second inner node 323 Q such that a first output at the first output node X 311 is independent from a second input at the second input node INB 305 and a second output at the second output node Y 321 is independent from a first input at the first input node IN 303. The third sub-circuit 330 can be also configured to be in a close state to conductively connect the first inner node P 313 and the second inner node Q 323, such that the first output at the first output node X 311 corresponds to the second input at the second input node INB 305 and the second output at the second output node Y 321 corresponds to the first input at the first input node IN 303.

In some implementations, the third sub-circuit 330 includes a n-type transistor $M_8$ 332 that has two terminals coupled to the first inner node P 313 and the second inner node Q 323 and a gate terminal for receiving a bias voltage $V_{BIAS}$. If a voltage of the first inner node P 313 is lower than a voltage of the second inner node Q 323, a terminal coupled to the first inner node P 313 can be a source terminal and a terminal coupled to the second inner node Q 323 can be a drain terminal. If a voltage of the first inner node P 313 is higher than a voltage of the second inner node Q 323, the terminal coupled to the first inner node P 313 can be a drain terminal and the terminal coupled to the second inner node Q 323 can be a source terminal.

A current ID through a transistor can be expressed as below:

$$I_D = \mu_n C_{ox} \frac{W}{L}\left[(V_{GS} - V_{th})V_{DS} - \frac{V_{DS}^2}{2}\right]$$

(Linear region), $$I_D = \frac{\mu_n C_{ox}}{2} \frac{W}{L}(V_{GS} - V_{th})^2$$

(Saturation region),
where $\mu_n$ represents a charge-carrier effective mobility, $C_{ox}$ capacitance of an oxide layer in the transistor, W and L represent a gate width and a gate length of the transistor, $V_{GS}$, $V_{DS}$ and Vth represent a voltage between the gate terminal and the source terminal, a voltage between the drain terminal and the source terminal, and a threshold voltage of the transistor, respectively.

Different transistors in a flip flop latch circuit can have various threshold voltages, e.g., due to manufacturing conditions. The various threshold voltages of the transistors can cause transistor mismatch (or device mismatch) issues in the flip flop latch circuit. For example, as illustrated in FIG. 3A, during a precharge phase when the clock signal is at a lower level, "0", and the data inputs at the input nodes IN 303 and INB 305 are "1" and "0", voltages at the output nodes X 311 and Y 321 can both be identical to the supply voltage $V_{DD}$ that corresponds to data bit "1". The transistors $M_3$ 316 and $M_4$ 326 are turned on to precharge voltages at the first and second inner nodes 313 P and 323 Q.

If the third sub-circuit is in an on phase during the precharge phase, e.g., by turning on the transistor $M_8$ 332 with the supply voltage $V_{DD}$ applied at the gate terminal if $V_{TH8}$ is smaller than $V_{TH3}$ or $V_{TH4}$, the inner nodes P and Q can be conductively connected. $V_{TH3}$, $V_{TH4}$, and $V_{TH8}$ are threshold voltages of the transistors 316, 326, and 332, respectively. Accordingly, the voltages at the inner nodes P and Q become the same and can be identical to $V_{DD}$-max ($V_{TH3}$, $V_{TH4}$). If the threshold voltages of the transistors 316 and 326 are different, e.g., $V_{TH3}$>$V_{TH4}$, one of the transistors $M_3$ 316 and $M_4$ 326 will have a non-zero voltage difference for $V_{GS}$-$V_{th}$, e.g., $V_{GS}$-$V_{th}$=$V_{TH3}$-$V_{TH4}$ that is not identical to 0, and the other one of the transistors $M_3$ 316 and $M_4$ 326 will have a zero voltage difference for $V_{GS}$-$V_{th}$. Thus, the transistors 316 and 326 can still have mismatch issues.

If the third sub-circuit 330 is in an off state during the precharge phase as shown in FIG. 3A, e.g., by turning off the transistor $M_8$ 332 with the bias voltage $V_{BIAS}$ as the gate voltage, the inner nodes P and Q can be conductively disconnected. Accordingly, the voltages at the inner nodes P and Q are independent from each other and can be precharged to $V_{DD}$-$V_{TH3}$ and $V_{DD}$-$V_{TH4}$, respectively. For the transistors $M_3$ 316 and $M_4$ 326, the voltage difference of $V_{GS}$ $V_{th}$ can both be identical to 0. Thus, mismatch issues can be avoided. To turn off the transistor $M_8$ 332, the bias voltage $V_{BIAS}$ needs to be smaller than $V_{DD}$ ($V_{TH3}$, $V_{TH4}$)-$V_{TH8}$. In a particular example, if the threshold voltages of the transistors 316, 326, and 332 are substantially identical, the bias voltage $V_{BIAS}$ needs to be smaller than the supply voltage $V_{DD}$.

As discussed with further details in FIGS. 3B and 3C, during the sensing phase and the latching phase, the third sub-circuit needs to be on, e.g., by turning on the transistors 332 with the bias voltage $V_{BIAS}$. To achieve this, the bias voltage $V_{BIAS}$ needs to be larger than $V_{TH8}$. Thus, the bias voltage $V_{BIAS}$ needs to be in a range as shows:

$V_{TH8}<V_{BIAS}<V_{DD}(V_{TH3}, V_{TH4})-V_{TH8}$.

Figures 5A, 5B:
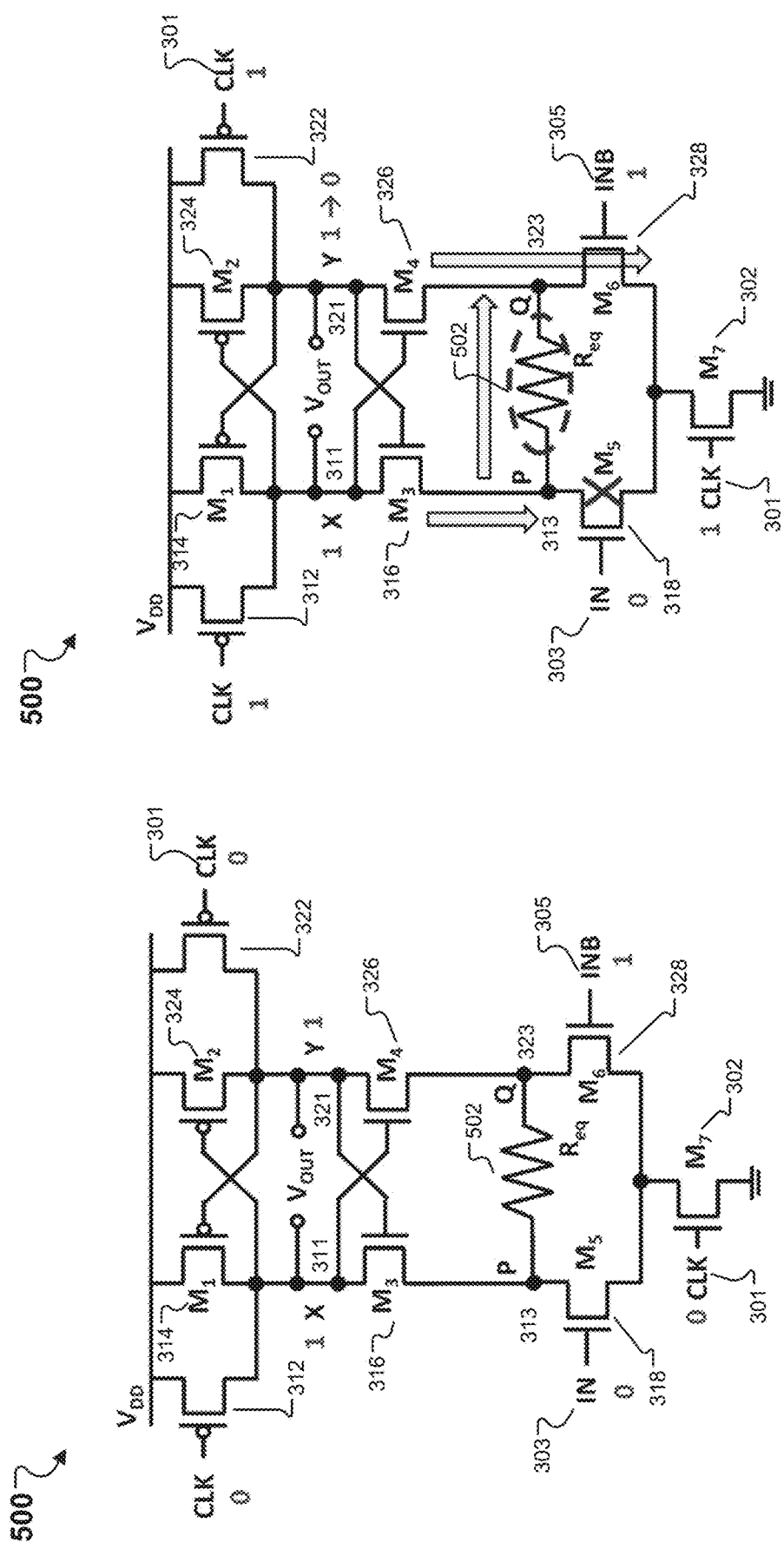
FIGS. 5A-5B are circuit diagrams illustrating an example flip flop latch circuit corresponding to the flip flop latch circuit of FIGS. 3A-3C.

Additionally, as discussed with further details in FIGS. 5A-5B, the bias voltage $V_{BIAS}$ can be associated with an equivalent resistance $R_{eq}$ of the third sub-circuit 330, which can affect a response time of the flip flop latch circuit 300. Thus, $V_{BIAS}$ can be adjusted or determined based on the response time and the characteristics of the transistors in the flip flop latch circuit 300. $V_{BIAS}$ can be predetermined and preconfigured by a manufacture of the flip flop latch circuit. Whenever the flip flop latch circuit 300 is powered on, the bias voltage $V_{BIAS}$ can be applied on the transistor 332.

As illustrated in FIG. 4, during the precharge phase, a voltage level 402 of the clock signal is at the lower level, "0". Voltage levels 404 and 406 of the inner nodes 313 P and 323 Q are precharged to a higher voltage. Voltage levels 408 and 410 of the output nodes 311 X and 321 Y are maintained at higher voltages, which correspond to "1" and "1". A voltage level 412 of latched data in the SR latch circuit 350 is at a lower level that corresponds to bit "0".

Referring back to FIG. 3B, after the clock signal rises to a higher level that corresponds to "1", as illustrated in FIG. 4, the flip flop latch circuit 300 enters into the sensing phase. The transistor $M_7$ 302 is turned on. As the data input at the input node IN 303 is "1" and the data input at the input node INB 305 is "0", the transistor M$_5$ 318 is turned on and the transistor M$_6$ 328 is turned off. When the third sub-circuit 330 is on, e.g., by turning on the transistor M$_8$ 332, a current flows from the second sub-circuit 320, e.g., from the transistor M$_4$ 326 to the first sub-circuit 310, e.g., to the transistor M$_5$ 318, and then to the ground through the transistor M$_7$ 302. Meanwhile, the transistors 312 and 322 are turned off, and a current flows from the output node X through the transistor M$_3$ 316 to the transistor M$_5$ 318, and then to the ground through the transistor M$_7$ 302. Thus, the voltage at the output node X begins to decrease. The voltages at the inner nodes 313 P and 323 Q are also starting to decrease.

As illustrated in FIG. 4, during the sensing phase, the clock signal maintains at the higher level corresponding to "1". The voltage levels 404 and 406 at the inner nodes P and Q first decrease to a lower level corresponding to "0", and then are stabilized at the lower level. As two current paths go across the inner node P and a current path goes across the inner node Q, as shown in FIG. 3B, the voltage level 404 at the inner node P decreases faster than the voltage level 406 at the inner node Q. The voltage level 408 at the output node X decreases to a lower level corresponding to "0", while the voltage level 410 at the output node Y maintains at the higher level corresponding to "1". Thus, by turning on the transistor M$_5$ 332 to conductively connect the inner nodes P 313 and Q 323, the voltage level "1" at the output node Y corresponds to the input at the input node IN 303, and the voltage level "0" at the output node X corresponds to the input at the input node INB 305. As the voltage level at the output node X gradually decreases from the higher voltage level to the lower voltage level, the outputs at the output nodes X and Y do not change an output of the SR latch circuit 350, as illustrated by plot 412 in FIG. 4.

Referring back to FIG. 3C, when the voltage level at the output node X decreases to the lower level corresponding to "0" and the voltage level at the output node Y maintains the higher level corresponding to "1," the flip flop latching circuit 300 enters into the latching phase. In the latching phase, the voltage level 402 of the clock signal maintains at the higher level, "1," the inner nodes P and Q maintain at the lower level, "0." Although the clock signal at the clock input node 301 turns off the transistors 314 and 324, the transistors 314 and 324 receive a high supply voltage V$_{DD}$ at the source terminals, and a subthreshold leakage current from the transistor 314 can occur, which can be dissipated through the transistor M$_5$ 318 and the transistor M$_7$ 302 to the ground. Any leakage current from the second sub-circuit 320 can be dissipated through the transistor M$_5$ 332.

As FIG. 3D shows, the voltage level "0" at the X node and the voltage level "1" at Y can set the latched data in the SR latch circuit 350 from "0" to "1" at the Q0 node (as FIG. 4 shows) and from "1" to "0" at the Q0B node. Similarly, at a next clock cycle, when the data inputs are "0" at the input node IN and "1" at the input node INB, the voltage levels at X and Y nodes become to "1" and "0", respectively, which can reset the latched data from "1" to "0" at the Q0 node and from "0" to "1" at the Q0B node.

Figure 5C:
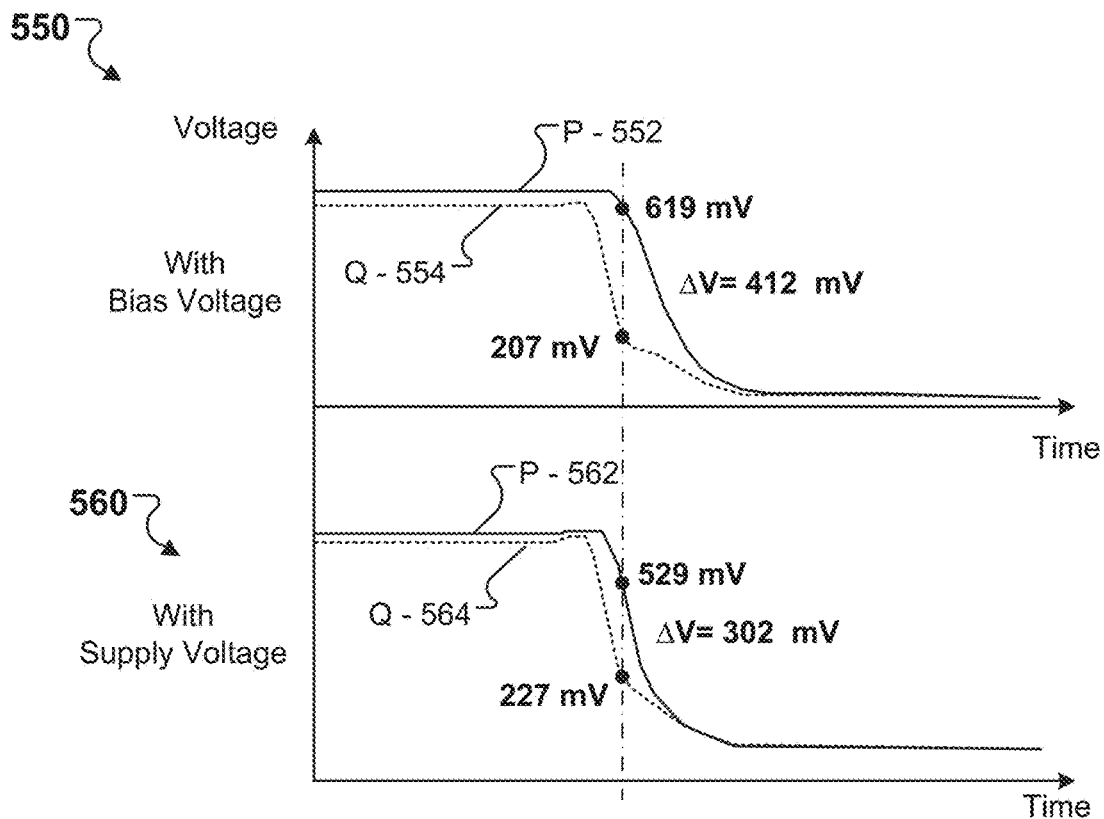
FIG. 5C is a schematic diagram illustrating changes of voltages in the flip flop latch circuit of FIGS. 5A-5B with a bias voltage compared to with a supply voltage.

FIGS. 5A-5B are circuit diagrams illustrating an example flip flop latch circuit 500 corresponding to the flip flop latch circuit 300 of FIGS. 3A-3C. The third sub-circuit 330 (e.g., the transistor M$_8$ 332 with the bias voltage V$_{BIAS}$ as the gate voltage of the transistor M$_5$ 332) has an equivalent resistance R$_{eq}$ 502, as shown in the flip flop latch circuit 500. FIG. 5C is a schematic diagram illustrating changes of voltages in the flip flop latch circuit 500 of FIGS. 5A-5B with the transistor M$_8$ with the bias voltage as the gate voltage, compared to with the transistor M$_5$ with a supply voltage as the gate voltage (e.g., in a strong arm latch circuit).

FIG. 5A shows a precharge phase of the flip flop latch circuit 500. Different from the precharge phase of the flip flop latch circuit 300 of FIG. 3A, data inputs at the input nodes IN 303 and INB 305 are "0" and "1", respectively. Similarly, voltages at inner nodes 313 P and 323 Q connected with the transistor M$_5$ (e.g., illustrated as equivalent resistance R$_{eq}$ 502) can be independently precharged to V$_{DD}$-V$_{TH3}$ and V$_{DD}$-V$_{TH4}$, respectively.

When the clock signal turns from a lower level "0" to a higher level "1", e.g., after a clock rising active edge, the voltages at the inner nodes 313 P and 323 Q start to change. As shown in FIG. 5B, as the data input at the input node IN 303 is "0" and the data input at the input node INB 305 is "1", the transistor M$_5$ 318 is turned off and the transistor M$_6$ 328 is turned on. A current flows along a first current path from the transistor M$_3$ 316 through the transistor M$_8$ 332 (e.g., the equivalent resistance R$_{eq}$ 502) to the transistor M$_6$ 328 then to the ground through the transistor M$_7$ 302. Another current flows along a second current path from the transistor M$_4$ 326 to the transistor M$_6$ 328 then to the ground through the transistor M$_7$ 302. Both of the voltages at the inner nodes 313 P and 323 Q decrease until being stabilized to a lower level, e.g., "0". Accordingly, voltages at the output nodes 311 X and 321 Y change until being stabilized to a higher level "1" and a lower level "0", respectively, which correspond to the data inputs at the input node INB 305 and the input node IN 303, respectively.

As illustrated in FIG. 5C, diagram 550 shows changes of voltages in the flip flop latch circuit 500 of FIGS. 5A-5B with the transistor M$_8$ with the bias voltage as the gate voltage. Plot 552 shows the voltage change at the inner node 313 P with time (from the precharge phase to the sensing phase), and plot 554 shows the voltage change at the inner node 323 Q with time (from the precharge phase to the sensing phase). It is shown that during the changing period, there is a voltage difference ΔV between the voltages at the inner nodes 313 P and 323 Q. The voltage difference ΔV varies during the changing period with a maximum value such as 412 mV. That is, the voltages at the inner nodes 313 P and 323 Q are pulled away to achieve stabilization. The voltage difference ΔV is associated with the equivalent resistance R$_{eq}$ 502. The larger the equivalent resistance R$_{eq}$ is, the voltage difference ΔV will be. The larger the voltage difference ΔV is, the faster the inner nodes P and Q will be stabilized, and accordingly, the voltages at the output nodes 311 X and 321 Y will be stabilized. That is, the hold time, e.g., the hold time 266 of FIG. 2C, of the flip flop latch circuit can be shorter.

In comparison, diagram 560 shows changes of voltages with the transistor M$_5$ with a supply voltage as the gate voltage (e.g., in a strong arm latch circuit). Plot 562 shows the voltage change at the inner node 313 P with time (from the precharge phase to the sensing phase), and plot 564 shows the voltage change at the inner node 323 Q with time (from the precharge phase to the sensing phase). It is shown that the voltage difference ΔV during the changing period with a maximum value such as 302 mV, which is smaller than that in diagram 550. That is, the hold time of the flip flop latch circuit is longer when using the supply voltage than when using the bias voltage.

As noted above, the flip flop latch circuit implemented in the present disclosure has a bias voltage predetermined to be in a range: V$_{TH8}$<V$_{BIAS}$<V$_{DD}$ (V$_{TH3}$, V$_{TH4}$)−V$_{TH8}$. During determination, the bias voltage can be adjusted within the range based on a hold time of the flip flop latch circuit. For example, a bias voltage with a shortest hold time can be determined to be a target bias voltage to be configured in the flip flop latch circuit.

Additionally, with the bias voltage as the gate voltage, the transistor $M_8$ is turned off during the precharge phase, while the transistors $M_8$ is turned on during the precharge phase with the supply voltage as the gate voltage. Thus, the voltages at the inner nodes P and Q can be precharged to corresponding values faster with the bias voltage as the gate voltage than that with the supply voltage as the gate voltage. Accordingly, the setup time of the flip flop latch circuit can be also shorter using the bias voltage as the gate voltage. Therefore, a response time, which is associated with the setup time and the hold time, of the flip flop latch circuit can be shorter using the bias voltage than that using the supply voltage.

Figure 6:
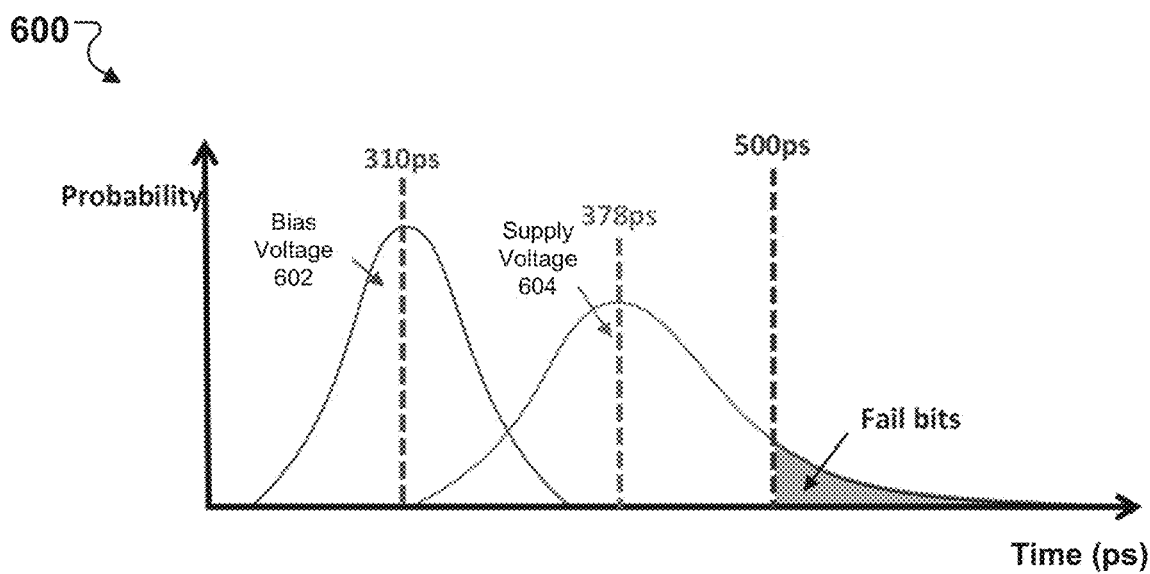
FIG. 6 is a schematic diagram illustrating an output yield relative to a circuit response time with a bias voltage compared to with a supply voltage.

FIG. 6 is a schematic diagram 600 illustrating an output yield relative to a circuit response time with a gate voltage of a transistor $M_8$ being a bias voltage compared to a supply voltage. As an example, it is assumed that a half of a clock period is 500 ps. With same conditions, an output yield 602 with a flip flop latch circuit using the bias voltage as the gate voltage is compared with an output yield 604 with the flip flop latch circuit using the supply voltage as the gate voltage. It is shown that the output yield 602 has a distribution (e.g., a Gaussian distribution) with a mean response time of 310 ps, while the output yield 604 has a distribution (e.g., a Gaussian distribution) with a mean response time of 378 ps. With the half of the clock period being 500 ps, the output yield 602 can have a yield of 100%, while the output yield 604 only has a yield of 94.2%, which causes fail bits. Thus, the flip flop latch circuit implemented in the present disclosure can have a shorter response time and faster speed, which can achieve a high yield with no or less fail bits.

Figure 7A:
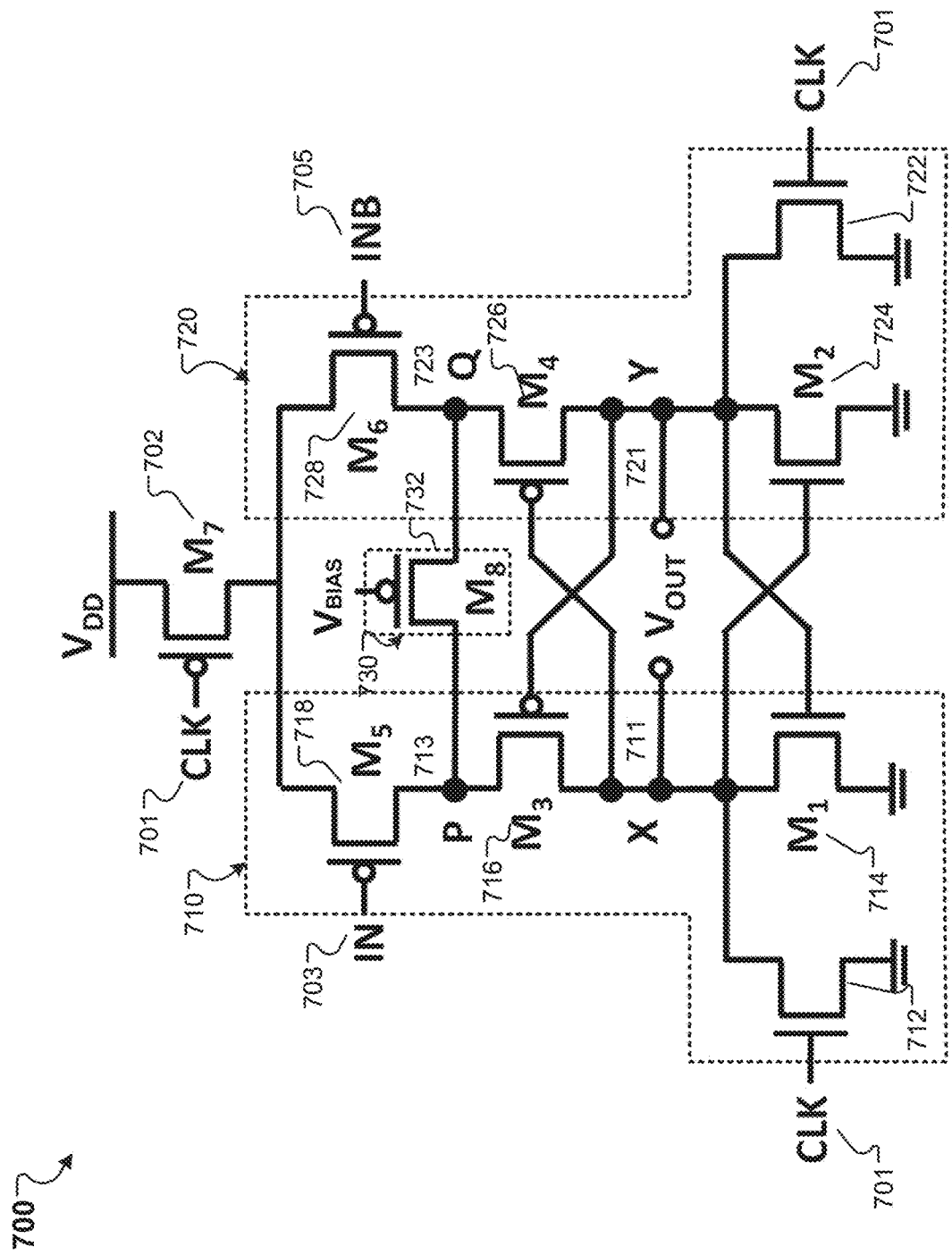
FIG. 7A is a circuit diagram illustrating another example flip flop latch circuit, according to one or more implementations of the present disclosure.

FIG. 7A is a circuit diagram illustrating another example flip flop latch circuit 700, according to one or more implementations of the present disclosure. Different from the flip flop latch circuit 300 of FIGS. 3A-3C that uses a n-type transistor as the transistor $M_8$, the flip flop latch circuit 700 uses a p-type transistor, e.g., p-MOSFET, as the transistor $M_8$. Accordingly, as described with further details below, in the flip flop latch circuit 700, transistors $M_3$, $M_4$, $M_5$, $M_6$, $M_7$ are p-type transistors, and transistors $M_1$ and $M_2$ are n-type transistors. Additionally, the flip flop latch circuit 700 latches data after a clock falling edge, not a clock rising edge for the flip flop latch circuit 300.

Similar to the flip flop latch circuit 300, the flip flop latch circuit 700 includes a first sub-circuit 710, a second sub-circuit 720, and a third sub-circuit 730. The flip flop latch circuit 700 can also include two data input nodes IN 703 and INB 705 for receiving inversed (or complemented) data inputs (e.g., 1 and 0 or 0 and 1), and a clock input node 701 for receiving a clock signal. The flip flop latch circuit 700 can also include first and second output nodes X 711 and Y 721, where VOUT can be a voltage difference between the output nodes X 711 and Y 721. The flop flop latch circuit 700 can further include a p-type transistor $M_7$ 702 that has a gate connected to the clock input node 701, a drain terminal connected to the first sub-circuit 710 and the second sub-circuit 720, and a source terminal connected to a supply voltage $V_{DD}$, instead of a ground.

The first sub-circuit 710 and the second sub-circuit 720 are symmetric to each other and are cross-connected with each other. For example, the first sub-circuit 710 includes an n-type transistor $M_1$ 714 and the second sub-circuit 720 includes an n-type transistor $M_2$ 724. The transistors 714 and 724 both are grounded at source terminals. A gate terminal of the transistor 714 is coupled to a drain terminal of the transistor 724, while a gate terminal of the transistor 724 is coupled to a drain terminal of the transistor 714. Similarly, the first sub-circuit 710 includes a p-type transistor $M_3$ 716 and the second sub-circuit 720 includes a p-type transistor $M_4$ 726. A gate terminal of the transistor 716 is coupled to a drain terminal of the transistor 726, while a gate terminal of the transistor 726 is coupled to a drain terminal of the transistor 716. The first output node X 711 is between the drain terminal of the transistor 714 and the drain terminal of the transistor 716, while the second output node Y 721 is between the drain terminal of the transistor 724 and the drain terminal of the transistor 726.

Additionally, the first sub-circuit 710 includes an n-type transistor 712 having a gate terminal coupled to the clock input node 701 for receiving the clock signal, and the second sub-circuit 720 includes an n-type transistor 722 having a gate terminal coupled to the clock input node 701 for receiving the clock signal. Both source terminals of the transistors 712 and 722 are coupled to the ground. A drain terminal of the transistor 712 is coupled between the drain terminal of the transistor 714 and the first output node X 711 in the first sub-circuit 710, while a drain terminal of the transistor 722 is coupled between the drain terminal of the transistor 724 and the second output node Y 721 in the second sub-circuit 720.

The first sub-circuit 710 includes a p-type transistor $M_5$ 718 that has a gate terminal coupled to the data input node IN 703, and the second sub-circuit 720 includes a p-type transistor $M_6$ 728 that has a gate terminal coupled to the data input node INB 705. Source terminals of the transistors 718 and 728 are both coupled to the drain terminal of the transistor $M_7$ 702. A drain terminal of the transistor 718 is coupled to a source terminal of the transistor 716 in the first sub-circuit 710, with a first internal node P 713 is between the drain terminal of the transistor 718 and the source terminal of the transistor 716. A drain terminal of the transistor 728 is coupled to a source terminal of the transistor 726 in the second sub-circuit 720, with a second internal node Q 723 is between the drain terminal of the transistor 728 and the source terminal of the transistor 726.

The third sub-circuit 730 is coupled between the first inner node P 713 of the first sub-circuit 710 and the second inner node Q 723 of the second sub-circuit 720. The third sub-circuit 730 can be configured to be in an open state to conductively disconnect the first inner node P 713 and the second inner node Q 723 such that a first output at the first output node X 711 is independent from a second input at the second input node INB 705 and a second output at the second output node Y 721 is independent from a first input at the first input node IN 703. The third sub-circuit 730 can be also configured to be in a close state to conductively connect the first inner node P 713 and the second inner node Q 723, such that the first output at the first output node X 711 corresponds to the second input at the second input node INB 705 and the second output at the second output node Y 721 corresponds to the first input at the first input node IN 703.

In some implementations, the third sub-circuit 730 includes a p-type transistor $M_8$ 732 that has source and drain terminals coupled to the first inner node P 713 and the second inner node Q 723, respectively and a gate terminal for receiving a bias voltage $V_{BIAS}$. The bias voltage can be determined to be within a range as follows:

$$\max(V_{TH3}, V_{TH4}) - V_{TH8} < V_{BIAS} < V_{DD} - V_{TH8},$$

where $V_{DD}$ and $V_{BIAS}$ represent the supply voltage and the bias voltage, respectively, $V_{TH3}$, $V_{TH4}$, and $V_{TH8}$ represent threshold voltages of the transistor $M_3$ 716, the transistor $M_4$ 726, and the transistor $M_5$ 732, respectively.

Figure 7C:
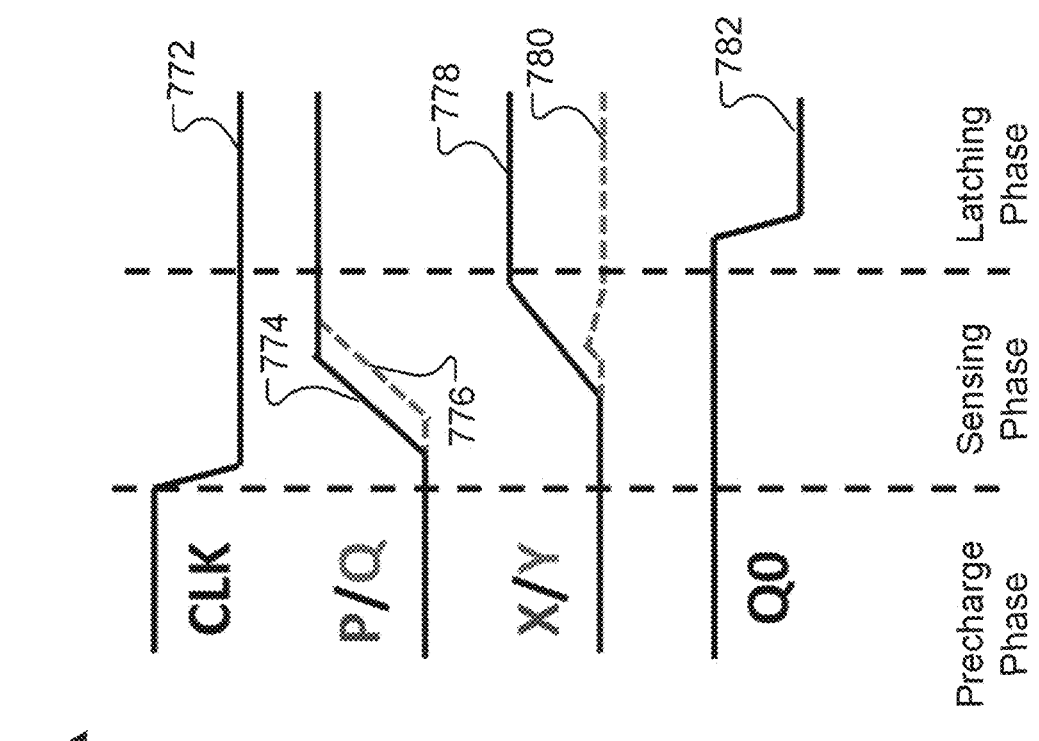
FIG. 7C is a schematic diagram illustrating changes of voltages in the flip flop latch circuit of FIG. 7A and the SR latch circuit of FIG. 7B.
Figure 7B:
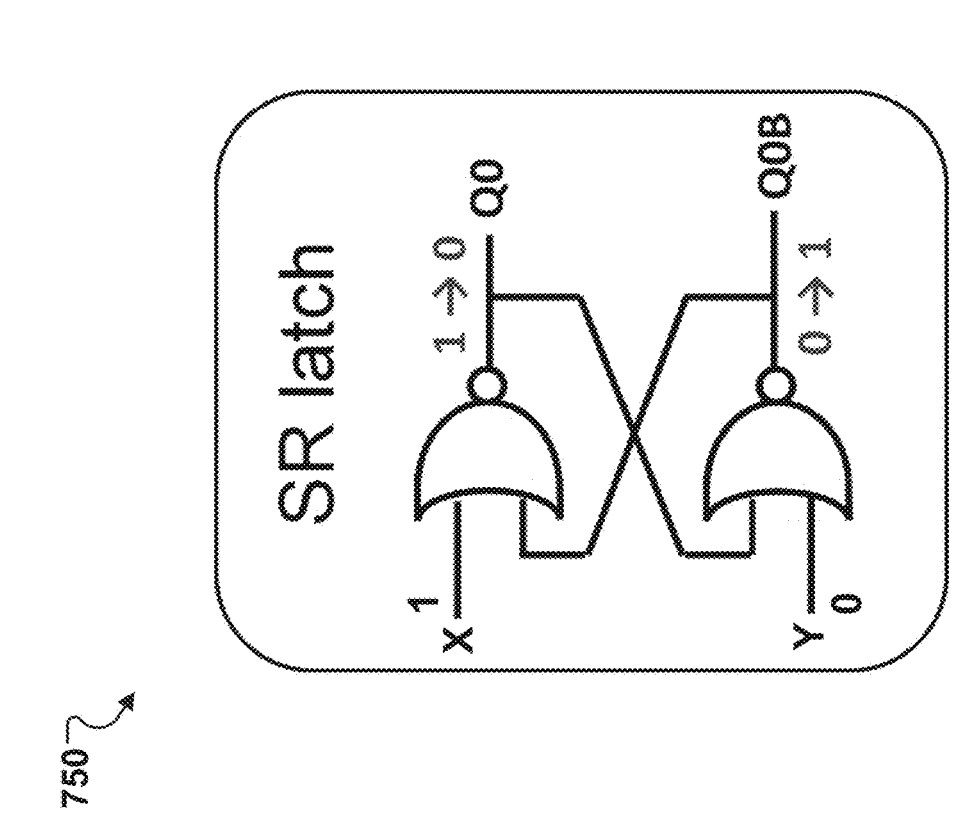
FIG. 7B is a circuit diagram illustrating an example SR latch circuit with an output changing with outputs of the flip flop latch circuit of FIG. 7A, according to one or more implementations of the present disclosure.

As illustrated in FIG. 7B, the flip flop latch circuit 700 can be coupled to an SR latch circuit 750, e.g., the SR latch circuit 244 of FIG. 2B or the SR latch circuit 350 of FIG. 3D. Outputs of the SR latch circuit 750 at output nodes Q0 and Q0B are determined by the outputs of the flip flop latch circuit 700 at the output nodes X 711 and Y 721.

FIG. 7C is a schematic diagram 770 illustrating changes of voltages in the flip flop latch circuit 700 of FIG. 7A and the SR latch circuit 750 of FIG. 7B, when the clock signal changes from a higher level "1" to a lower level "0" after the clock falling edge and the data inputs at the input nodes IN and INB are "0" and "1".

As illustrated in FIG. 7C, plot 772 shows a change of the clock signal, plot 774 and 776 respectively show the voltage changes at the inner nodes P 713 and Q 723, plot 778 and 780 respectively show the voltage changes at the output nodes X 711 and Y 721, and plot 782 shows the output change at the output node Q0 of the SR latch circuit 750.

During the precharge phase, the clock signal is at the higher level "1". Voltages at the inner nodes P and Q are independently identical to the respective threshold voltages $V_{TH3}$, $V_{TH4}$. Voltages at the output nodes X and Y are both discharged to a lower level "0". Data latched in the SR latch circuit 750 are "1" at the Q0 node and "0" at the Q0B node. During the sensing phase, the clock signal changes to the lower level "0". The voltages at the inner nodes P and Q start to increase to higher levels "1". The voltage at the output node X increases from "0" to "1", while the voltage at the output node Y keeps at "0". The latched data in the SR latch circuit 750 is latched and keeps unchanged. During the latching phase, the latched data in the SR latch circuit 750 is set to "0" at Q0 node and "1" at Q0B node.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. An integrated circuit comprising:
a first sub-circuit having a first input node, a first output node, and a first inner node between the first input node and the first output node;
a second sub-circuit having a second input node, a second output node, and a second inner node between the second input node and the second output node; and
a third sub-circuit coupled between the first inner node of the first sub-circuit and the second inner node of the second sub-circuit and configured to:
be in an open state to conductively disconnect the first inner node and the second inner node; and
be in a close state to conductively connect the first inner node and the second inner node, such that a first output at the first output node corresponds to a second input at the second input node and a second output at the second output node corresponds to a first input at the first input node,
wherein each of the first sub-circuit and the second sub-circuit is configured to receive a supply voltage, and wherein the third sub-circuit is configured to receive a bias voltage that is different from the supply voltage.

2. The integrated circuit of claim 1, wherein the first sub-circuit comprises a first transistor coupled with the first inner node and the first output node, and the second sub-circuit comprises a second transistor coupled with the second inner node and the second output node,
wherein the third sub-circuit comprises a third transistor having a gate terminal configured to receive the bias voltage, a source terminal coupled to the first inner node and a drain terminal coupled to the second inner node, and
wherein the third transistor is configured to:
be on to turn the third sub-circuit into the close state, and
be off to turn the third sub-circuit into the open state.

3. The integrated circuit of claim 2, wherein each of the first sub-circuit and the second sub-circuit has a clock input node configured to receive a clock signal having a first state and a second state,
wherein, when the clock input node is at the first state, the first transistor and the second transistor are turned on, the third transistor is turned off, and a voltage at the first inner node and a voltage at the second inner node are independent from each other, and
wherein, when the clock input node is switched from the first state to the second state, the third transistor is turned on, such that a current flows from one of the first and second inner nodes to the other one of the first and second inner nodes through the third transistor to cause the first output at the first output node to correspond to the second input at the second input node and the second output at the second output node to correspond to the first input at the first input node.

4. The integrated circuit of claim 3, wherein the first sub-circuit further comprises a fourth transistor and the second sub-circuit further comprises a fifth transistor,
wherein source terminals of the fourth and fifth transistors are coupled to the supply voltage, a drain terminal of the fourth transistor and a gate terminal of the fifth transistor are coupled to the first output node, and a drain terminal of the fifth transistor and a gate terminal of the fourth transistor are coupled to the second output node,
wherein, when the clock input node is at the second state, the third transistor is on such that a leakage current from one of the fourth and fifth transistors is discharged through the third transistor to keep the first output and the second output unchanged, and
wherein the fourth and fifth transistors have a transistor type different from that of the first, second, and third transistors.

5. The integrated circuit of claim 3, wherein the first sub-circuit further comprises a sixth transistor having a gate terminal as the first input node and a drain terminal coupled to the first inner node,
wherein the second sub-circuit further comprises a seventh transistor having a gate terminal as the second input node and a drain terminal coupled to the second inner node, and
wherein the integrated circuit further comprises an eighth transistor having a drain terminal coupled to source terminals of the sixth transistor and the seventh transistor, a gate terminal configured to receive the clock signal, and a source terminal coupled to a ground or the supply voltage.

6. The integrated circuit of claim 3, wherein the first transistor has a drain terminal coupled to the first output node, a gate terminal coupled to the second output node, and a source terminal coupled to the first inner node,
wherein the second transistor has a drain terminal coupled to the second output node, a gate terminal coupled to the first output node, and a source terminal coupled to the second inner node, and
wherein, when the clock input node is at the first state, a voltage at the first output node is identical to $V_{DD}$, a voltage at the second output node is identical to $V_{DD}$, the voltage at the first inner node is identical to $V_{DD}-V_{TH1}$, and the voltage at the second inner node is identical to $V_{DD}-V_{TH2}$, where $V_{DD}$ represents the supply voltage, $V_{TH1}$, $V_{TH2}$ represent threshold voltages of the first transistor and the second transistor, respectively.

7. The integrated circuit of claim 2, wherein each of the first, second, and third transistor is a respective p-type transistor, and
wherein the bias voltage is configured to be within a voltage range as follows:

$$\max(V_{TH1}, V_{TH2})-V_{TH3}<V_{BIAS}<V_{DD}-V_{TH3},$$

where $V_{DD}$ and $V_{BIAS}$ represent the supply voltage and the bias voltage, respectively, $V_{TH1}$, $V_{TH2}$, and $V_{TH3}$ represent threshold voltages of the first transistor, the second transistor, and the third transistor, respectively.

8. The integrated circuit of claim 1, comprising a flip-flop having the first sub-circuit, the second sub-circuit, and the third sub-circuit,
wherein the second input is complementary to the first input.

9. The integrated circuit of claim 8, wherein the flip-flop further comprises:
a latching circuit configured to receive the first output from the first output node of the first sub-circuit and the second output from the second output node of the second sub-circuit.

10. A device comprising:
an interface configured to receive data; and
a plurality of flip flop circuits, each of the plurality of flip flop circuits comprising:

a first sub-circuit having a first input node, a first output node, and a first inner node between the first input node and the first output node;

a second sub-circuit having a second input node, a second output node, and a second inner node between the second input node and the second output node; and a third sub-circuit coupled between the first inner node of the first sub-circuit and the second inner node of the second sub-circuit and configured to:

be in an open state to conductively disconnect the first inner node and the second inner node; and be in a close state to conductively connect the first inner node and the second inner node, such that a first data output at the first output node corresponds to a second data input at the second input node and a second data output at the second output node corresponds to a first data input at the first input node, the second data input being complementary to the first data input, wherein each of the first sub-circuit and the second sub-circuit is configured to receive a supply voltage, and the third sub-circuit is configured to receive a bias voltage that is different from the supply voltage.

11. The device of claim 10, wherein the first sub-circuit comprises a first transistor coupled with the first inner node and the first output node, and the second sub-circuit comprises a second transistor coupled with the second inner node and the second output node, wherein the third sub-circuit comprises a third transistor having a gate terminal configured to receive the bias voltage, a source terminal coupled to the first inner node and a drain terminal coupled to the second inner node, wherein each of the first sub-circuit and the second sub-circuit has a clock input node configured to receive a clock signal having a first state and a second state, wherein, when the clock input node is at the first state, the first transistor and the second transistor are turned on, the third transistor is turned off, and a voltage at the first inner node and a voltage at the second inner node are independent from each other, and wherein, when the clock input node is switched from the first state to the second state, the third transistor is turned on, such that a current flows from one of the first and second inner nodes to the other one of the first and second inner nodes through the third transistor to cause the first data output correspond to the second data input and the second data output correspond to the first data input.

12. The device of claim 11, wherein the first sub-circuit further comprises a fourth transistor and the second sub-circuit further comprises a fifth transistor, wherein source terminals of the fourth and fifth transistors are coupled to the supply voltage, a drain terminal of the fourth transistor and a gate terminal of the fifth transistor are coupled to the first output node, and a drain terminal of the fifth transistor and a gate terminal of the fourth transistor are coupled to the second output node, wherein, when the clock input node is at the second state, the third transistor is on such that a leakage current from one of the fourth and fifth transistors is discharged through the third transistor to keep the first data output and the second data output unchanged, and wherein the fourth and fifth transistors have a transistor type different from that of the first, second, and third transistors.

13. The device of claim 11, wherein the first sub-circuit further comprises a sixth transistor having a gate terminal as the first input node and a drain terminal coupled to the first inner node, wherein the second sub-circuit further comprises a seventh transistor having a gate terminal as the second input node and a drain terminal coupled to the second inner node, and wherein the flip flop circuit further comprises an eighth transistor having a drain terminal coupled to source terminals of the sixth transistor and the seventh transistor, a gate terminal configured to receive the clock signal, and a source terminal coupled to a ground or the supply voltage.

14. The device of claim 11, wherein the first transistor has a drain terminal coupled to the first output node, a gate terminal coupled to the second output node, and a source terminal coupled to the first inner node, wherein the second transistor has a drain terminal coupled to the second output node, a gate terminal coupled to the first output node, and a source terminal coupled to the second inner node, and wherein, when the clock input node is at the first state, a voltage at the first output node is identical to $V_{DD}$, a voltage at the second output node is identical to $V_{DD}$, the voltage at the first inner node is identical to $V_{DD}-V_{TH1}$, and the voltage at the second inner node is identical to $V_{DD}-V_{TH2}$, where $V_{DD}$ represents the supply voltage, $V_{TH1}$, $V_{TH2}$ represent threshold voltages of the first transistor and the second transistor, respectively.

15. The device of claim 11, wherein each of the first, second, and third transistor is a respective p-type transistor, and wherein the bias voltage is configured to be within a voltage range as follows:

$$\max(V_{TH1},V_{TH2})-V_{TH3}<V_{BIAS}<V_{DD}-V_{TH3},$$

where $V_{DD}$ and $V_{BIAS}$ represent the supply voltage and the bias voltage, respectively, $V_{TH1}$, $V_{TH2}$, and $V_{TH3}$ represent threshold voltages of the first transistor, the second transistor, and the third transistor, respectively.

16. The device of claim 10, wherein each of the plurality of flip flop circuits further comprises:

a latching circuit configured to receive the first data output from the first output node of the first sub-circuit and the second data output from the second output node of the second sub-circuit and provide an output corresponding to at least one of the first data output or the second data output.

17. A flip flop circuit comprising:

a first latching circuit comprising:

a first sub-circuit having a first input node, a first output node, and a first inner node between the first input node and the first output node;

a second sub-circuit having a second input node, a second output node, and a second inner node between the second input node and the second output node; and a third sub-circuit coupled between the first inner node of the first sub-circuit and the second inner node of the second sub-circuit and configured to:

be off to conductively disconnect the first inner node and the second inner node, and be on to conductively connect the first inner node and the second inner node, such that a first data output at the first output node corresponds to a second data input at the second input node and a second data output at the second output node corresponds to a first data input at the first input node, the second data input being complementary to the first data input, wherein each of the first sub-circuit and the second sub-circuit is configured to receive a supply voltage, and the third sub-circuit is configured to receive a bias voltage that is different from the supply voltage; and a second latching circuit configured to receive the first data output from the first output node and the second data output from the second output node and provide an output corresponding to at least one of the first data output or the second data output.

18. The flip flop circuit of claim 17, wherein the first sub-circuit comprises a first transistor coupled with the first inner node and the first output node, and the second sub-circuit comprises a second transistor coupled with the second inner node and the second output node, wherein the third sub-circuit comprises a third transistor having a gate terminal configured to receive the bias voltage, a source terminal coupled to the first inner node and a drain terminal coupled to the second inner node, wherein each of the first sub-circuit and the second sub-circuit has a clock input node configured to receive a clock signal having a first state and a second state, wherein, when the clock input node is at the first state, the first transistor and the second transistor are turned on, the third transistor is turned off, and a voltage at the first inner node and a voltage at the second inner node are independent from each other, and wherein, when the clock input node is switched from the first state to the second state, the third transistor is turned on, such that a current flows from one of the first and second inner nodes to the other one of the first and second inner nodes through the third transistor to cause the first data output correspond to the second data input and the second data output correspond to the first data input.

19. The flip flop circuit of claim 18, wherein the first sub-circuit further comprises a fourth transistor and the second sub-circuit further comprises a fifth transistor, wherein source terminals of the fourth and fifth transistors are coupled to the supply voltage, a drain terminal of the fourth transistor and a gate terminal of the fifth transistor are coupled to the first output node, and a drain terminal of the fifth transistor and a gate terminal of the fourth transistor are coupled to the second output node, wherein, when the clock input node is at the second state, the third transistor is on such that a leakage current from one of the fourth and fifth transistors is discharged through the third transistor to keep the first data output and the second data output unchanged, wherein the fourth and fifth transistors have a transistor type different from that of the first, second, and third transistors, wherein the first sub-circuit further comprises a sixth transistor having a gate terminal as the first input node and a drain terminal coupled to the first inner node, wherein the second sub-circuit further comprises a seventh transistor having a gate terminal as the second input node and a drain terminal coupled to the second inner node, and wherein the flip flop circuit further comprises an eighth transistor having a drain terminal coupled to source terminals of the sixth transistor and the seventh transistor, a gate terminal configured to receive the clock signal, and a source terminal coupled to a ground or the supply voltage.

20. The flip flop circuit of claim 18, wherein the first transistor has a drain terminal coupled to the first output node, a gate terminal coupled to the second output node, and a source terminal coupled to the first inner node, wherein the second transistor has a drain terminal coupled to the second output node, a gate terminal coupled to the first output node, and a source terminal coupled to the second inner node, and wherein, when the clock input node is at the first state, a voltage at the first output node is identical to $V_{DD}$, a voltage at the second output node is identical to $V_{DD}$, the voltage at the first inner node is identical to $V_{DD}-V_{TH1}$, and the voltage at the second inner node is identical to $V_{DD}-V_{TH2}$, where $V_{DD}$ represents the supply voltage, $V_{TH1}$, $V_{TH2}$ represent threshold voltages of the first transistor and the second transistor, respectively.

* * * * *